(12) United States Patent
Yamanaka et al.

(10) Patent No.: US 8,415,678 B2
(45) Date of Patent: Apr. 9, 2013

(54) SEMICONDUCTOR DEVICE AND DISPLAY DEVICE

(75) Inventors: Masaki Yamanaka, Osaka (JP); Hiroshi Nakatsuji, Osaka (JP); Naoki Makita, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 13/321,411

(22) PCT Filed: May 20, 2010

(86) PCT No.: PCT/JP2010/058531
§ 371 (c)(1), (2), (4) Date: Nov. 29, 2011

(87) PCT Pub. No.: WO2010/134571
PCT Pub. Date: Nov. 25, 2010

(65) Prior Publication Data
US 2012/0068182 A1 Mar. 22, 2012

(30) Foreign Application Priority Data
May 21, 2009 (JP) ................................. 2009-123519

(51) Int. Cl.
*H01L 31/0368* (2006.01)
(52) U.S. Cl.
USPC ................... 257/72; 257/59; 257/66; 257/70; 257/E21.412
(58) Field of Classification Search ................. 257/59, 257/66, 72, 70, 292, 431, E21.412, E33.053, 257/E31.043
See application file for complete search history.

(56) References Cited

U.S. PATENT DOCUMENTS
7,358,165 B2 * 4/2008 Shoji et al. .................... 438/487
2005/0023531 A1 2/2005 Shoji et al.
(Continued)

FOREIGN PATENT DOCUMENTS
JP 1988-27066 U 2/1988
JP H6-275807 A 9/1994
(Continued)

OTHER PUBLICATIONS
International Search Report (ISR) issued in PCT/JP2010/058531 (International application) mailed in Jun. 2010 for Examiner consideration.
(Continued)

*Primary Examiner* — Dung A. Le
(74) *Attorney, Agent, or Firm* — Chen Yoshimura LLP

(57) ABSTRACT

A semiconductor device of the present invention is a semiconductor device including a thin film transistor and a thin film diode. A semiconductor layer (113) of the thin film transistor and a semiconductor layer (114) of the thin film diode are both crystalline semiconductor layers. The semiconductor layer (113) of the thin film transistor and the semiconductor layer (114) of the thin film diode respectively include portions formed by crystallizing the same amorphous semiconductor film. The thickness of the semiconductor layer (114) of the thin film diode is greater than the thickness of the semiconductor layer (113) of the thin film transistor. The difference between the thickness of the semiconductor layer (113) of the thin film transistor and the thickness of the semiconductor layer (114) of the thin film diode is greater than 25 nm. The surface roughness of the semiconductor layer (114) of the thin film diode is larger than the surface roughness of the semiconductor layer (113) of the thin film transistor. As a result, the thin film transistor and the thin film diode achieve respective required characteristics.

10 Claims, 11 Drawing Sheets

U.S. PATENT DOCUMENTS

| | | |
|---|---|---|
| 2005/0045881 A1 | 3/2005 | Nakamura et al. |
| 2008/0164473 A1 | 7/2008 | Tai et al. |
| 2009/0050891 A1 | 2/2009 | Katoh |
| 2010/0065851 A1 | 3/2010 | Makita |
| 2011/0198608 A1 | 8/2011 | Yamanaka et al. |
| 2012/0068182 A1 | 3/2012 | Yamanaka et al. |

FOREIGN PATENT DOCUMENTS

| | | |
|---|---|---|
| JP | H6-275808 A | 9/1994 |
| JP | 2003-249639 A | 9/2003 |
| JP | 2005-72126 A | 3/2005 |
| JP | 2006-3857 A | 1/2006 |
| JP | 2008-171871 A | 7/2008 |
| WO | 2006/129428 A1 | 12/2006 |
| WO | 2008/132861 A1 | 11/2008 |
| WO | 2010/050161 A1 | 5/2010 |

OTHER PUBLICATIONS

U.S. Appl. No. 13/125,776, filed Apr. 22, 2011.
International Search Report (ISR) issued in PCT/JP2009/005575 of the related U.S. Appl. No. 13/125,776 mailed in Dec. 2009.

* cited by examiner (A)

(B)

(C)

(D)

(E)

(F)

(G)

(H)

(I)

(J)

(A)

(B)

(C)

(D)

(E)

(F)

(G)

(H)

Input Control Signal into Backlight Circuit

SEMICONDUCTOR DEVICE AND DISPLAY DEVICE

TECHNICAL FIELD

The present invention relates to a semiconductor device equipped with a Thin Film Transistor (TFT) and a Thin Film Diode (TFD), a method of manufacturing the same, and a display device using the semiconductor device.

BACKGROUND ART

In recent years, semiconductor devices having thin film transistors (TFTs) and thin film diodes (TFDs) on the same substrate and electronic devices including such semiconductor devices have been developed. As a method of manufacturing such semiconductor devices, forming semiconductor layers for the TFTs and the TFDs of the same crystalline semiconductor film formed on a substrate has been proposed.

Patent Document 1 discloses an image sensor in which an optical sensor unit utilizing a TFD and a driver circuit utilizing a TFT are formed on the same substrate. In Patent Document 1, semiconductor layers of the TFT and the TFD are formed by crystallizing an amorphous semiconductor film formed on the substrate.

When the TFT and the TFD are formed in a unified manner on the same substrate as described above, the size of the semiconductor device can be reduced. Additionally, it leads to a significant cost advantage such as the reduction in the number of parts required. Further, it also makes it possible to provide a product with new additional features, which would not be available by conventional part combinations.

On the other hand, Patent Document 2 discloses a technology of forming a TFT of crystalline silicon (crystalline silicon TFT) and a TFD of amorphous silicon (amorphous silicon TFD) on the same substrate using the same semiconductor film (amorphous silicon film). Specifically, a catalyst element that facilitates the crystallization of amorphous silicon is added only to the region that is to be an active region of the TFT in the amorphous silicon film formed on a substrate. Then, a heat treatment is performed so as to form a silicon film in which the crystallization has occurred only in the region that is to be an active region of the TFT, and the region that is to be a TFD remains amorphous. By using such a silicon film, a crystalline silicon TFT and an amorphous silicon TFD can be formed on the same substrate with ease.

Further, Patent Document 3 discloses forming an optical sensor TFT that functions as an optical sensor and a switching TFT that functions as a switching element using the same semiconductor film (amorphous silicon film). More specifically, the channel region of the optical sensor TFT is formed of an amorphous silicon film, and the source and drain regions of the optical sensor TFT and the active region of the switching TFT are formed of a crystalline silicon film. Also, by making the amorphous silicon film for the channel region of the optical sensor TFT thicker than the crystalline silicon film for the active region of the switching TFT, the sensitivity of the optical sensor is improved.

Patent Document 3 discloses the following method to create the above-mentioned TFTs so that they become different from each other. First, an amorphous silicon film is formed on a substrate. Next, in the photolithography to form island-shape films of the amorphous silicon film, the amorphous silicon film is partially thinned with the half exposure technology using a gray tone mask. In this manner, a plurality of amorphous silicon layers having different thicknesses are provided. After that, these amorphous silicon layers are irradiated with laser light such that the thinned regions of the amorphous silicon layers (the regions that become the source and drain regions of the optical sensor TFT and the active region of the switching TFT) are crystallized, and the region that has not been thinned (the region that becomes the channel region of the optical sensor TFT) remains amorphous.

RELATED ART DOCUMENTS

Patent Documents

Patent Document 1: Japanese Patent Application Laid-Open Publication No. H6-275808
Patent Document 2: Japanese Patent Application Laid-Open Publication No. H6-275807
Patent Document 3: Japanese Patent Application Laid-Open Publication No. 2005

SUMMARY OF THE INVENTION

Problems to be Solved by the Invention

According to Patent Document 1, the semiconductor layer of a TFT and the semiconductor layer of a TFD are both formed by crystallizing the same amorphous semiconductor film. There is, however, a problem with this method that device characteristics required for the TFT and for the TFD are different from each other because their respective uses are different, and it is difficult to satisfy the respective device characteristics required for the TFT and for the TFD at the same time.

In the methods disclosed in Patent Document 2 and Patent Document 3, the semiconductor layers of the TFT and the TFD in different crystal states are formed from the same amorphous semiconductor film. However, it is difficult to achieve the optimized crystal state for each semiconductor layer with the disclosed manufacturing processes. Also, with the methods disclosed in Patent Document 2 and Patent Document 3, it is still difficult to obtain a TFT and a TFD with excellent characteristics as explained hereinafter.

In the method of Patent Document 2, a single amorphous semiconductor film is partially crystallized, and a TFT (crystalline silicon TFT) is formed of the crystallized portion and a TFD (amorphous silicon TFD) is formed of the portion left amorphous. This method can improve characteristics of the crystalline silicon TFT by controlling the conditions for crystallization. However, during the heat treatment process in which a part of the amorphous silicon film is crystallized and changed to crystalline silicon, hydrogen included in the original amorphous silicon film is lost. This causes a problem of not being able to fabricate an electrically reliable amorphous silicon TFD using the portion that remains amorphous after the heat treatment process. That is because, in the amorphous silicon film shortly after the formation, bond hands of silicon atoms are bonded with hydrogen (terminated), but during the heat treatment process for crystallization, the bonding between the silicon elements and hydrogen is broken and the hydrogen is thereby lost, resulting in a poor quality amorphous silicon having a large number of dangling bonds of silicon. Also, for the method disclosed in Patent Document 3, for the reason similar to above, it is difficult to obtain an electrically reliable optical sensor TFT (amorphous silicon TFT).

As described above, when a semiconductor device is manufactured by forming a TFT and a TFD of the same amorphous semiconductor film in the conventional techniques, it is difficult to achieve both of the characteristics respectively required for the TFT and the TFD. As a result, a high-performance semiconductor device may not be obtained.

The present invention was made in view of the above-mentioned problems. It is an object of the present invention to achieve characteristics respectively required for a thin film transistor and for a thin film diode in a semiconductor device having a thin film transistor and a thin film diode on the same substrate.

Means for Solving the Problems

A semiconductor device of the present invention includes: a thin film transistor that has a semiconductor layer including a channel region, a source region, and a drain region, a gate electrode that controls a conductivity of the channel region, and a gate insulating film disposed between the semiconductor layer and the gate electrode; and a thin film diode that has a semiconductor layer including at least an n-type region and a p-type region, wherein the semiconductor layer of the thin film transistor and the semiconductor layer of the thin film diode are both crystalline semiconductor layers, wherein the semiconductor layer of the thin film transistor and the semiconductor layer of the thin film diode include portions formed by crystallizing a same amorphous semiconductor film, wherein a thickness of the semiconductor layer of the thin film diode is greater than a thickness of the semiconductor layer of the thin film transistor, wherein a difference between the thickness of the semiconductor layer of the thin film transistor and the thickness of the semiconductor layer of the thin film diode is greater than 25 nm, and wherein a surface roughness of the semiconductor layer of the thin film diode is greater than a surface roughness of the semiconductor layer of the thin film transistor.

In a preferred embodiment, an arithmetic average roughness Ra of a surface of the semiconductor layer of the thin film diode is greater than an arithmetic average roughness Ra of a surface of the semiconductor layer of the thin film transistor.

In a preferred embodiment, a maximum height Rz of the surface of the semiconductor layer of the thin film diode is greater than a maximum height Rz of the surface of the semiconductor layer of the thin film transistor.

In a preferred embodiment, ridges are formed on the surfaces of the semiconductor layer of the thin film transistor and the semiconductor layer of the thin film diode, wherein an average height of the ridges formed on the surfaces of the semiconductor layer of the thin film diode is greater than an average height of the ridges formed on the surface of the semiconductor layer of the thin film transistor.

In a preferred embodiment, the ridges are present on boundaries of crystal grains included in the semiconductor layers.

The thin film diode may further include an intrinsic region disposed between the n-type region and the p-type region of the semiconductor layer of the thin film diode. In the semiconductor layer of the thin film diode, a surface roughness of at least the intrinsic region may be greater than the surface roughness of the semiconductor layer of the thin film transistor.

The thin film transistor may be a plurality of thin film transistors including an N-channel thin film transistor and a P-channel thin film transistor.

A method of manufacturing a semiconductor device according to the present invention is a method for manufacturing a semiconductor device that includes a thin film transistor and a thin film diode on a same substrate, wherein a thickness and a surface roughness of a semiconductor layer of the thin film diode are greater than a thickness and a surface roughness of a semiconductor layer of the thin film transistor, respectively, and includes: (a) forming a first film made of a crystalline semiconductor in a first region of the substrate that includes a region in which the thin film diode is to be formed, wherein the first film is not formed in a second region including a region in which the thin film transistor is to be formed; (b) forming a second film made of an amorphous semiconductor in the first region and the second region of the substrate; (c) crystallizing the second film by radiating laser light over the second film to form a crystalline semiconductor film including the first film and the second film that has been crystallized; and (d) patterning the crystalline semiconductor film to form a semiconductor layer that becomes an active region of the thin film diode in the first region, and to form a semiconductor layer that becomes an active region of the thin film transistor in the second region.

In a preferred embodiment, the step (a) includes forming a film made of an amorphous semiconductor at least in the first region, and crystallizing the film made of an amorphous semiconductor by laser light irradiation to obtain the first film.

It is preferable that the thickness of the first film in the above-mentioned step (a) be greater than 25 nm.

The substrate may be a transparent substrate. The manufacturing method may further include forming a light shielding layer that blocks light from entering through a surface on the opposite side of the substrate in the first region of the substrate, prior to the step (a). The step (a) may include (a1) forming a film made of a crystalline semiconductor on the substrate having the light shielding layer formed thereon, (a2) forming a resist layer by forming a resist film on a film made of the crystalline semiconductor and by exposing and developing the resist film, and (a3) etching the film made of the crystalline semiconductor using the resist layer as a mask to obtain the first film. The step (a2) may include exposing the resist film from a surface on the opposite side of the substrate using the light shielding layer as a mask.

A display device of the present invention is a display device that includes: a display region having a plurality of display units; a frame region disposed around the display region; and an optical sensor unit including a thin film diode, wherein each of the display units has an electrode and a thin film transistor connected to the electrode, wherein the thin film transistor and the thin film diode are formed on the same substrate, wherein the thin film transistor includes a semiconductor layer including a channel region, a source region, and a drain region, a gate insulating film disposed so as to cover the semiconductor layer, and a gate electrode disposed on the gate insulating film, wherein the thin film diode includes a semiconductor layer including at least an n-type region and a p-type region, wherein the semiconductor layer of the thin film transistor and the semiconductor layer of the thin film diode are both crystalline semiconductor layers, wherein the semiconductor layer of the thin film transistor and the semiconductor layer of the thin film diode include portions formed by crystallizing the same amorphous semiconductor film, wherein a thickness of the semiconductor layer of the thin film diode is greater than a thickness of the semiconductor layer of the thin film transistor, wherein a difference between the thickness of the semiconductor layer of the thin film diode and the thickness of the semiconductor layer of the thin film transistor is greater than 25 nm, and wherein a surface roughness of the semiconductor layer of the thin film diode is greater than a surface roughness of the semiconductor layer of the thin film transistor.

In a preferred embodiment, the display region further includes a backlight and a backlight control circuit that adjusts a luminance of light emitted by the backlight, wherein the optical sensor unit generates illuminance signals according to the brightness of ambient light and outputs the signal to the backlight control circuit.

In a preferred embodiment, the display device has a plurality of optical touch sensor units each of which has the aforementioned optical sensor unit, wherein each of the plurality of optical touch sensor units are disposed in the display region so as to correspond to each of the display units or to each of a set of two or more display units.

Effects of the Invention

According to the present invention, in the semiconductor device having a TFT and a TFD formed on the same substrate, semiconductor layers of the TFT and the TFD can be optimized according to device characteristics required for respective elements. Therefore, the respective device characteristics required for the TFT and for the TFD can be both achieved.

A TFD of the present invention is suitably used as an optical sensor in particular. The surface roughness of the semiconductor layer of the TFD is greater than the surface roughness of the semiconductor layer of the TFT. Therefore, in the TFD, the reflection of light by the surface of the semiconductor layer can be suppressed, resulting in the improvement of the optical sensitivity thereof. Additionally, the thickness of the semiconductor layer of the TFD is greater than the thickness of the semiconductor layer of the TFT, resulting in the improvement of the optical absorption rate. As a result, the optical sensitivity is further improved. Therefore, the light utilization efficiency of the optical sensor can be greatly enhanced and the light/dark ratio (SN ratio) can be thereby improved. On the other hand, in the TFT, because the surface roughness of the semiconductor layer is maintained low, the reliability (gate breakdown voltage) can be ensured. Also, because the thickness of the semiconductor layer is maintained low, an OFF current can be reduced. Further, subthreshold characteristics such as a threshold voltage can be improved.

Also, according to the manufacturing method of the present invention, the above-mentioned semiconductor device can be manufactured with ease without increasing the manufacturing steps or the manufacturing cost, and therefore, a more compact, higher-performance product can be achieved at a lower cost.

DETAILED DESCRIPTION OF EMBODIMENTS

Figure 1:
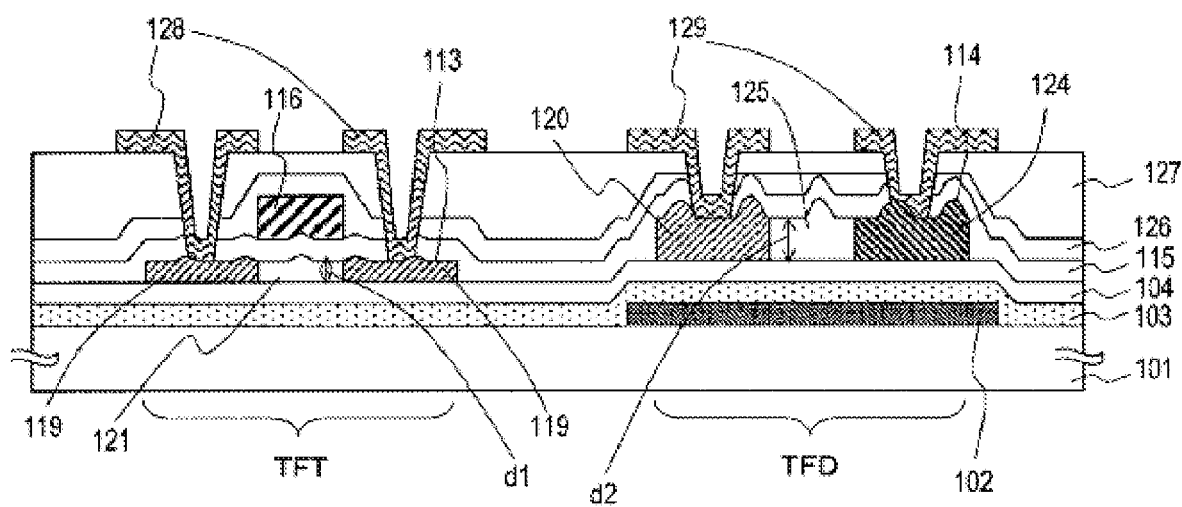
FIG. 1 is a cross-sectional diagram schematically showing a semiconductor device according to Embodiment 1 of the present invention.

The inventors of the present application conducted studies from various perspectives regarding a relationship between structures of semiconductor layers of a TFT and a TFD and their device characteristics in order to optimize the respective device characteristics of the TFT and the TFD formed on the same substrate. As a result, it was found out that, by controlling surface roughnesses of the semiconductor layers of the TFT and the TFD, the device characteristics respectively required for the TFT and for the TFD can be both achieved regardless of the crystal states of these semiconductor layers.

Specifically, in the TFD (an optical sensor TFD used as an optical sensor), by making the surface unevenness of the semiconductor layer larger, the reflection of light incident upon the semiconductor layer can be suppressed, and the light current can be thereby increased. As a result, the sensitivity to ambient light, or the light SN ratio (the ratio of the current value under the light to the current value in the darkness) can be improved. On the other hand, in the TFT, if the surface unevenness of the semiconductor layer is large, the reliability thereof (gate breakdown voltage, in particular) is lowered, and for this reason, it is preferable to reduce the surface unevenness of the semiconductor layer of the TFT as much as possible.

Also, by increasing the thickness of the semiconductor layer of the TFD, the optical absorption rate of the semiconductor layer can be improved. Therefore, by increasing the thickness as well as the surface unevenness of the semiconductor layer of the TFD, the SN ratio can be more effectively improved by the synergistic effect.

The invention of the present application was made based on the above-described findings, and is characterized in that the surface roughness of the semiconductor layer of the TFD is greater than the surface roughness of the semiconductor layer of the TFT, and the semiconductor layer of the TFD is thicker than the semiconductor layer of the TFT. This makes it possible to increase the light current and thereby improve the light utilization efficiency of the TFD as well as to ensure a high reliability of the TFT.

The inventors of the present application also found out that, when the surface unevenness generated in the crystallization of an amorphous semiconductor film is used to make the surface roughness of the semiconductor layer of the TFD larger than the surface roughness of the semiconductor layer of the TFT, the manufacturing process can be greatly simplified as explained in detail below.

After the semiconductor film is once melted by laser light irradiation, crystal nuclei are generated, and the solidification starts from the crystal nuclei and continues sequentially. In the last crystal grains to solidify, because of the difference in volumes between a melted state and a solid state, the grain boundary zone rises like a mountain ridge, or at a point of a triple junction or more (multiple junctions) that makes the border of three or more crystals, the surface rises like a mountain. The above-mentioned surface unevenness is created in this manner. In this specification, the raised portions shaped like a mountain ridge and like a mountain are both referred to as "ridge."

In a TFT, it has been previously considered that, when such a ridge is present on a surface of a semiconductor layer (channel interface), it causes the deterioration of interfacial characteristics or a field effect mobility and the deterioration of breakdown voltage characteristics of a gate insulating film due to the concentration of electric fields at the tip portion of the ridge, resulting in an insufficient reliability. Thus, the reduction of the ridge has been considered as an important issue, and there have been various studies conducted in an effort to reduce the ridge.

In contrast, the inventors of the present application conducted a study on a process to utilize such a ridge for the improvement of characteristics of a TFD. As a result, it was found that the size of the ridge generated on a surface of a semiconductor film can be controlled by the thickness of the semiconductor film. It appears that this is because the ridge is generated due to the volume differences between a melted state and a solid state of the semiconductor film, and therefore, as the volume of the entire semiconductor film (thickness) increases, the larger ridge will be created.

Based on such findings, the inventors of the present application found that, by utilizing the ridges, a semiconductor layer of a TFT and a semiconductor layer of a TFD that has the greater thickness and surface roughness than those of the semiconductor layer of the TFT can be formed without making the manufacturing process complicated, which led them to the present invention.

In a manufacturing method of the present invention, first, a first film made of a crystalline semiconductor is formed in a region of a substrate surface in which a TFD is to be formed. The first film is not formed in a region in which a TFT is to be formed. Next, in the regions in which the TFT and the TFD are to be formed, a second film made of an amorphous semiconductor is formed. After that, the laser irradiation is performed for the second film from above the substrate so as to crystallize the second film. In this manner, a crystalline semiconductor film made of the first film and a film that is the crystallized second film is obtained.

In crystallizing an amorphous semiconductor film, as described above, as the thickness (volume) of the amorphous semiconductor film increases, the ridge formed on the surface in the crystallization becomes larger. According to the present invention, in the region in which the TFD is to be formed, not only the second film made of an amorphous semiconductor, but also a surface portion of the first film disposed under the second film are melted and then solidified. Therefore, the volume of the semiconductor film that is melted and solidified is greater than the volume of the semiconductor film in the region in which the TFT is to be formed. Ridges formed on the surface of the crystalline semiconductor film thereby become larger in the region in which the TFD is to be formed than in the region in which the TFT is to be formed. As a result, the surface roughness of the crystalline semiconductor film becomes greater in the region in which the TFD is to be formed than in the region in which the TFT is to be formed. Also, the thickness of the crystalline semiconductor film becomes greater, by the thickness of the first film, in the region in which the TFD is to be formed than in the region in which the TFT is to be formed.

As described above, in crystallizing the second film, the surface portion of the first film that has been already crystallized is also melted and solidified. The first film and the second film are thereby unified, creating the partially thick crystalline semiconductor film. Therefore, in the obtained crystalline semiconductor film, a boundary portion between a film formed by crystallizing the second film and the first film is not clear.

Next, in the crystalline semiconductor film, a semiconductor layer of the TFT is formed using the portion having a smaller thickness and a smaller surface roughness, and a semiconductor layer of the TFD is formed using the portion having a greater thickness and a greater surface roughness.

As described above, according to the present invention, there is no need to significantly increase the number of the manufacturing process steps or complicate the manufacturing process in order to make the surface roughness and the thicknesses of the semiconductor layers of the TFT and the TFD different from each other. Also, in contrast to the methods described in Patent Documents 2 and 3, there is no need to control the crystal state of each semiconductor layer separately. Therefore, the semiconductor layers can be formed with a simpler process.

In the above-mentioned method described in Patent Document 3, the laser irradiation is performed for the amorphous semiconductor film that has been partially thinned. Here, the irradiation conditions (such as an irradiation energy) and the semiconductor film thickness are set such that only the thinner portion is crystallized and the thicker portion that has not been thinned remains amorphous. In this case, because no ridge is formed on the surface of the portion left amorphous, the surface roughness thereof becomes much lower than the surface roughness of the crystallized portion. Therefore, with this method, it is not possible to form a thick semiconductor layer with a high surface roughness. On the other hand, in the method according to the invention of the present application, the entire amorphous semiconductor film (second film) is crystallized by the laser irradiation, leaving no amorphous portion. Therefore, in the crystalline semiconductor film obtained after the crystallization, ridges whose sizes are proportional to the volume of the film that has been melted and solidified are formed over the entire surface.

Also, the unpublished Japanese Patent Application No. 2008-276023 by the applicants of the present invention discloses a method to form a semiconductor layer of a TFT having a smaller thickness and a smaller surface roughness and a semiconductor layer of a TFD having a greater thickness and a greater surface roughness of the same amorphous semiconductor film by performing the laser irradiation to a partially thinned amorphous semiconductor film. This method is advantageous from a manufacturing process standpoint, because two types of semiconductor layers can be formed by a single crystallization process. This method, however, has a problem that ΔD, which is a difference in thicknesses between the semiconductor layer of the TFD and the semiconductor layer of the TFT, cannot be further increased (to exceed 25 nm, for example). That is because, when the thickness difference ΔD is too big, it may cause poor crystallization in a thicker portion of the amorphous semiconductor film (a portion that becomes the active region of the TFD)

during the crystallization process, resulting in decreasing the surface roughness thereof instead.

In contrast, according to the method of the present invention, another crystallization process is performed to crystallize the first film, separately from the process to crystallize the second film. Therefore, the thickness of the first film can be selected with the high degree of flexibility according to the desired thickness difference ΔD. By making the thickness of the first film greater than 25 nm, for example, the thickness difference ΔD between the semiconductor layers of the TFT and the TFD can be made larger than 25 nm. It is also possible to create differences in surface roughnesses by using not only the difference in thicknesses (volumes) of the semiconductor film that is melted and solidified during the crystallization of the second film, but also the surface unevenness formed on the second film that follows the profile of the ridges formed on the surface of the first film. Therefore, in the film obtained after the crystallization, the surface roughness of the portion that becomes the active region of the TFD can be increased effectively. As a result, it becomes possible to further increase the thickness and the surface roughness of the semiconductor layer of the TFD, and therefore, characteristics of the optical sensor TFD can be further improved, while ensuring the characteristics of the TFT.

Here, the difference in the crystal states between the semiconductor layer formed by the method described in the above-mentioned Japanese Patent Application No. 2008-276023 and the semiconductor layer formed by the method according to the present invention will be explained.

In the method described in the above-mentioned Japanese Patent Application No. 2008-276023, the laser crystallization is performed for an amorphous semiconductor film having portions of different thicknesses. Here, the optimal values of the laser irradiation energy are different between the thicker portion and the thinner portion of the amorphous semiconductor film, and therefore, sizes of the crystal grains formed therein also differ. When the irradiation is performed with the optimal energy for a portion that becomes the semiconductor layer of the TFT (thinner portion), for example, the crystal grain size of a portion that becomes the semiconductor layer of the TFD (thicker portion) becomes smaller than the crystal grain size of the portion that becomes the semiconductor layer of the TFT.

In contrast, according to the present invention, when the first film is formed by the laser crystallization, for example, the irradiation energy can be optimized for the first film, and therefore, the first film having the optimal crystal state can be formed. After that, when the crystallization of the second film is performed, by optimizing the irradiation energy for the portion of the second film that becomes the semiconductor layer of the TFT, the portion that becomes the semiconductor layer of the TFT can be crystallized with the optimal irradiation energy (such that the crystal grains of the almost same size as those of the first film can be formed, for example). Here, in a portion of the second film that is positioned above the first film and that becomes the semiconductor layer of the TFD, the second film is melted and solidified with a portion of the first film. Therefore, the crystallization develops using crystals of the first film as the nuclei. As a result, in the portion of the second film that becomes the semiconductor layer of the TFD as well, the crystal grains are formed in the almost same size as that of the crystal grains of the first film. As described above, according to the present invention, the crystal grains of the semiconductor layers of the TFD and the TFT can be formed in the almost same size (in other words, the almost same crystal states can be achieved). Thus, as compared with the case in which the method described in the above-mentioned Japanese Patent Application No. 2008-276023 is used, the crystal grain size of the semiconductor layer of the TFD can be increased, and the crystallinity thereof can be enhanced. Therefore, the TFD with a higher performance can be formed.

The crystallinity (crystal grain size) of the semiconductor layers of the TFD and the TFT can be examined by EBSP (Electron Back Scattering Pattern) method or the like, for example.

In the above-mentioned method, before forming the first film, a light shielding layer may be formed in the region in which the TFD is to be formed. In this case, after a crystalline semiconductor film that is used to form the first film is formed on a substrate, the exposure may be performed for the crystalline semiconductor film from the back surface of the substrate using the light shielding layer as a mask so that the crystalline semiconductor film can be patterned in a self-aligned manner. The number of photomasks can therefore be reduced.

It is preferable that the thickness of the first film in the above-mentioned method be over 25 nm. The thickness difference ΔD between the semiconductor layer of the TFD and the semiconductor layer of the TFT can therefore be over 25 nm. As a result, the optical absorption rate of the semiconductor layer of the TFD can be greatly improved, while ensuring the characteristics of the TFT.

In this specification, "surface roughness" refers to the arithmetic average roughness Ra or the maximum height Rz defined by JIS B 0601-2001. Therefore, it is sufficient if at least one of the two conditions is met: the arithmetic average roughness Ra of the semiconductor layer of the TFD is greater than the arithmetic average roughness Ra of the semiconductor layer of the TFT, or the maximum height Rz of the semiconductor layer of the TFD is greater than the maximum height Rz of the semiconductor layer of the TFT. This makes it possible to make the reflection of light by the surface of the semiconductor layer of the TFD lower than the reflection of light by the surface of the semiconductor layer of the TFT.

More specifically, in this embodiment, the maximum height Rz is defined by the height of the highest ridge regardless of the number of ridges disposed on the surface (density). On the other hand, the arithmetic average roughness Ra becomes greater if the density of the ridges is high, even when the height of the ridges is low. Considering the growth mechanism of the ridges, if the thickness of the semiconductor films is same, as the density of the ridges becomes lower (the crystal grain size becomes bigger), the ridges tend to become higher. As described here, the height of the ridges can be changed not only by the volume of the semiconductor film (thickness), but also by the crystal grain size.

Here, as the respective ridges formed on the surface of the semiconductor layer become higher, the reflection of light caused by the ridges can be suppressed more effectively, and the characteristics of the optical sensor TFD can be thereby improved. Therefore, when the maximum height Rz of the surface of the semiconductor layer of the TFD is greater than the maximum height Rz of the surface of the semiconductor layer of the TFT, the above-mentioned effects can be obtained regardless of the value of the arithmetic average roughness Ra.

Also, as the density of the ridges formed on the surface of the semiconductor layer becomes higher, or as the arithmetic average roughness Ra becomes greater, the reflection of light can be suppressed more effectively. Therefore, when the arithmetic average roughness Ra of the surface of the semiconductor layer of the TFD is greater than the arithmetic average roughness Ra of the surface of the semiconductor layer of the TFT, the above-mentioned effects can be obtained regardless of the value of the maximum height Rz.

It is, however, preferable that the arithmetic average roughness Ra of the surface of the semiconductor layer of the TFD be greater than the arithmetic average roughness Ra of the surface of the semiconductor layer of the TFT, and the maximum height Rz of the surface of the semiconductor layer of the TFD be greater than the maximum height Rz of the surface of the semiconductor layer of the TFT. That is because, in this way, the reflection of light can be suppressed and the SN ratio of the TFD can be improved more reliably, while ensuring the reliability of the TFT.

Embodiment 1

Hereinafter, Embodiment 1 of a semiconductor device according to the present invention will be explained with reference to figures. The semiconductor device according to this embodiment has an N-channel TFT and a TFD formed on the same substrate, and is used as an active matrix type display device equipped with a sensor unit, for example.

FIG. 1 is a cross-sectional diagram schematically showing an example of the semiconductor device according to this embodiment. The semiconductor device of this embodiment typically has a plurality of TFTs and a plurality of TFDs formed on the same substrate, but a configuration illustrated here only has a single TFT and a single TFD for convenience. Also, as an example of the TFT, an N-channel TFT that has a single drain structure is shown here, but the structure of the TFT is not limited to such. A TFT of an LDD structure or a GOLD structure may be disposed, or a plurality of TFTs including an N-channel TFT and a P-channel TFT may be disposed, for example.

The semiconductor device of this embodiment includes a TFT and a TFD formed on underlying films 103 and 104 that are disposed on a substrate 101. The TFT has a semiconductor layer 113 including a channel region 121, and source and drain regions 119, a gate insulating film 115 disposed on the semiconductor layer 113, a gate electrode 116 that controls the conductivity of the channel region 121, and electrodes/wiring lines 128 respectively connected to the source and drain regions 119. The TFD has a semiconductor layer 114 at least including an n-type region 120 and a p-type region 124 and electrodes/wiring lines 129 respectively connected to the n-type region 120 and the p-type region 124. In the example shown in the figure, an intrinsic region 125 is disposed between the n-type region 120 and the p-type region 124 in the semiconductor layer 114.

On the TFT and the TFD, a silicon nitride film 126 and a silicon oxide film 127 are formed as interlayer insulating films. When a transparent substrate is used as the substrate 101, a light shielding film 102 may be disposed between the semiconductor layer 114 of the TFD and the substrate 101 so as to prevent light from coming in the semiconductor layer 114 from the back surface of the substrate 101.

The semiconductor layer 113 of the TFT and the semiconductor layer 114 of the TFD are both crystalline semiconductor layers. Also, these crystalline semiconductor layers include portions formed by crystallizing the same amorphous semiconductor film. The thickness d2 of the semiconductor layer 114 of the TFD is greater than the thickness d1 of the semiconductor layer 113 of the TFT. Also, the surface roughness of the semiconductor layer 114 of the TFD is greater than the surface roughness of the semiconductor layer 113 of the TFT.

On the surfaces of these semiconductor layers 113 and 114, ridges are formed. The ridges are generated in a process in which an amorphous semiconductor film is melted and solidified when the amorphous semiconductor film is irradiated with laser light for crystallization. The ridges are typically present on the boundaries of the crystal grains included in the semiconductor layers 113 and 114. In this embodiment, the average height of the ridges formed on the surface of the semiconductor layer 114 of the TFD is greater than the average height of the ridges formed on the surface of the semiconductor layer 113 of the TFT. The surface roughness of the semiconductor layer 114 is therefore greater than the surface roughness of the semiconductor layer 113.

The semiconductor device of this embodiment has the following advantages.

In the TFD (an optical sensor TFD, in particular) of this embodiment, the thickness d2 of the semiconductor layer 114 is greater than the thickness d1 of the semiconductor layer 113 of the TFT. This increases the optical absorption rate of the semiconductor layer 114 of the TFD, and the sensitivity of the TFD can therefore be enhanced. Also, the surface roughness of the semiconductor layer 114 of the TFD is greater than the surface roughness of the semiconductor layer 113 of the TFT. Therefore, on the surface of the semiconductor layer 114, the reflection of incident light is suppressed by the surface unevenness, resulting in the further enhancement of the optical sensitivity. As a result, with such a synergistic effect, the light current upon illumination can be increased, and the light/dark ratio, which is the SN ratio, can be enhanced.

On the other hand, in the TFT of this embodiment, because the thickness d1 of the semiconductor layer 113 is small, the OFF current can be reduced, resulting in the enhancement of switching characteristics (the ON/OFF current ratio). Also, upon the ON operation of the TFT, the complete depletion can be achieved faster, resulting in improvement of sub-threshold characteristics such as the threshold voltage. Further, because the surface roughness of the semiconductor layer 113 is maintained at a low level, the breakdown voltage characteristics and the reliability to gate bias stress of the gate insulating film 115 can be enhanced, and the field effect mobility can also be improved.

As described above, according to this embodiment, the thicknesses and the surface roughnesses of the semiconductor layer 113 of the TFT and the semiconductor layer 114 of the TFD can be made different without making their crystallinities greatly different from each other so that the respective element characteristics can be optimized according to the respective requirements.

When the semiconductor layer 114 of the TFD includes the intrinsic region 125, if at least the surface roughness of the intrinsic region 125 of the semiconductor layer 114 of the TFD is greater than the surface roughness of the semiconductor layer 113 of the TFT (the surface roughness of the channel region 121 in particular), the effects similar to above can be obtained.

Figure 2:
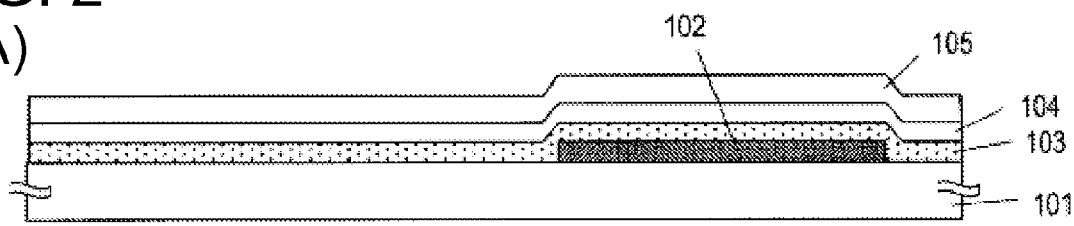
FIGS. 2(A) to 2(E) are cross-sectional diagrams schematically showing manufacturing steps of the semiconductor device according to Embodiment 1 of the present invention.
Figure 2:
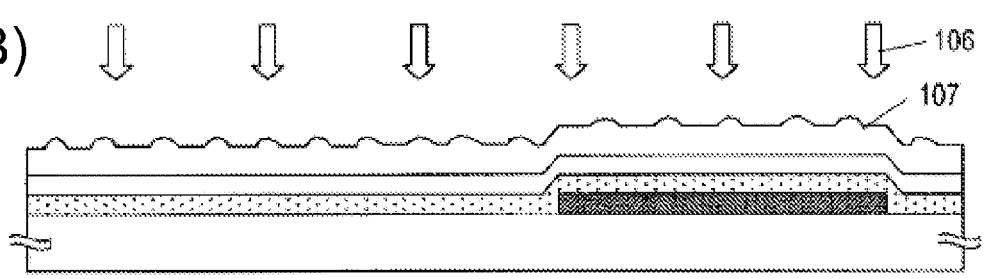
Figure 2:
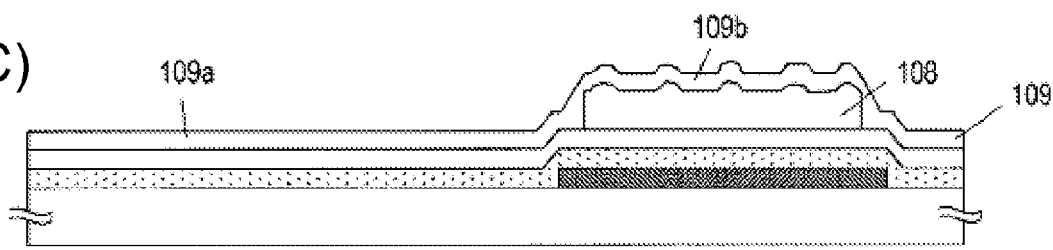
Figure 2:
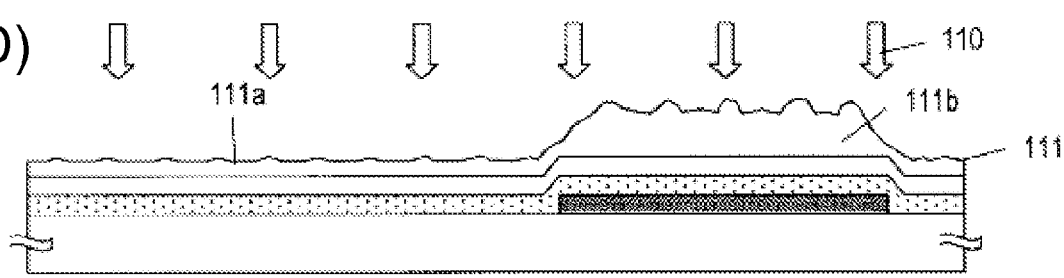
Figure 2:
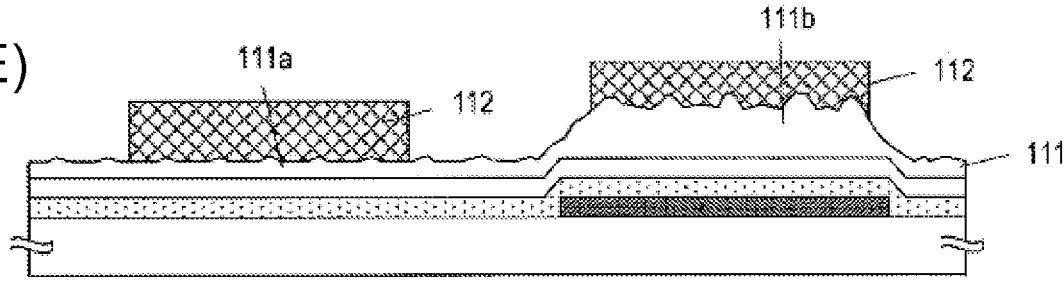

In this embodiment, it is preferable that the difference $\Delta D$ between the thickness d1 of the semiconductor layer 113 of the TFT and the thickness d2 of the semiconductor layer 114 of the TFD be 5 nm or more. When the thickness difference $\Delta D$ is smaller than 5 nm, it is difficult to make a desired difference for the surface roughnesses between the semiconductor layers 113 and 114 in the laser crystallization process, which may cause a difficulty in achieving both device characteristics for the TFT and for the TFD at the same time. It is more preferable that the above-mentioned difference $\Delta D$ be over 25 nm. This makes it possible to enhance the SN ratio of the TFD more effectively, while ensuring the characteristics of the TFT. On the other hand, when the above-mentioned difference $\Delta D$ becomes too large, the wiring lines 128 and 129 may be broken due to the level difference, or the size of the semiconductor device may be increased. Also, in the manufacturing method described later, the difference ΔD is substantially same as the thickness of the first film (FIG. 2(C)), and it can sometimes be difficult to form a first film having such a great thickness by crystallization. When the first film is formed by crystallizing an amorphous semiconductor film using an excimer laser as a crystallization device, for example, if the amorphous semiconductor film to be crystallized is too thick, it may reach the thickness limit for crystallization. This thickness limit is about 110 nm, for example, considering the laser energy and the transmittance of the amorphous semiconductor (a-Si) film. Therefore, it is preferable that the difference ΔD (=thickness of the first film) be 110 nm or less.

It is preferable to set the thicknesses d1 and d2 of the semiconductor layers 113 and 114 of the TFT and of the TFD such that the thickness difference ΔD stays within the above-mentioned range, although the thicknesses are not particularly limited to such. Here, the thickness d1 of the semiconductor layer 113 is set to 30 nm or more and 50 nm or less and the thickness d2 of the semiconductor layer 114 is set to 55 nm or more and 110 nm or less.

There is no particular limitation on the surface roughness of the semiconductor layers 113 and 114, but when the thickness of the semiconductor layer 113 of the TFT is set to 40 nm, and the thickness of the semiconductor layer 114 of the TFD is set to 100 nm, for example, it is preferable that the arithmetic average roughness Ra of the surface of the semiconductor layer 113 be set to 4 nm or more and 6 nm or less, and the arithmetic average roughness Ra of the surface of the semiconductor layer 114 be set to 10 nm or more and 16 nm or less. Also, it is preferable that the maximum height Rz of the surface of the semiconductor layer 113 be set to 30 nm or more and 50 nm or less, and the maximum height Rz of the surface of the semiconductor layer 114 be set to 90 nm or more and 150 nm or less. When the surface roughnesses of the semiconductor layers 113 and 114 are within the above-mentioned ranges, the optical sensitivity (a light current value) of the TFD is enhanced by about 3.8 times as compared with the optical sensitivity of a TFD formed of a semiconductor layer having the thickness and the surface roughness equal to those of a TFT (Ra: 4 to 6 nm), for example. This enhancement ratio of the optical sensitivity is the value when the thickness of the semiconductor layer 114 is greater than the thickness of the semiconductor layer 113 by 2.5 times, and the surface roughness of the semiconductor layer 114 is greater than the surface roughness of the semiconductor layer 113 by 1.5 times, and the enhancement ratio of the optical sensitivity of this embodiment is not limited to such.

Hereinafter, an example of a manufacturing method of the semiconductor device according to this embodiment will be explained with reference to figures.

First, as shown in FIG. 2(A), a light shielding layer 102 is formed on a substrate 101. Next, a silicon nitride film 103 and a silicon oxide film 104 are formed thereon as underlying films. After that, a first amorphous semiconductor film (here, an amorphous silicon film) 105 is formed over the substrate 101.

As the substrate 101, a low alkali glass substrate or a quartz substrate can be used. In this embodiment, a low alkali glass substrate is used. In this case, the substrate may be heat-treated at a temperature that is about 10 to 20° C. lower than the glass strain point in advance.

The light shielding layer 102 is disposed so as to block the light coming from the opposite surface of the substrate to the TFD. For a material of the light shielding layer 102, a metal film, a silicon film, or the like can be used. When a metal film is used, it is preferable to use a high melting point metal, such as tantalum (Ta), tungsten (W), or molybdenum (Mo), considering the heat treatment performed later in the manufacturing process. In this embodiment, an Mo film is formed by sputtering and patterned to form the light shielding layer 102. The light shielding layer 102 is made to be 20 to 200 nm thick, or preferably to be 30 to 150 nm thick. In this embodiment, the thickness is set to 100 nm, for example.

The silicon nitride film 103 and the silicon oxide film 104 are disposed to prevent the diffusion of impurities from the substrate 101. In this embodiment, these underlying films 103 and 104 are formed using the plasma CVD method. The combined thickness of these underlying films 103 and 104 is 100 to 600 nm, or preferably 150 to 450 nm. The two layers of underlying films are used in this embodiment, but a single layer of a silicon oxide film, for example, can be used without any problem.

The amorphous silicon film 105 can be formed by a known method such as the plasma CVD method or sputtering. The thickness of the first amorphous silicon film 105 is 30 nm or more and 60 nm or less. Here, the thickness is set to 60 nm, for example.

Next, as shown in FIG. 2(B), the laser irradiation with laser light 106 is performed for the first amorphous silicon film 105 from above the substrate 101 so as to crystallize the first amorphous silicon film 105, and a first crystalline silicon film 107 is thereby obtained. In this embodiment, XeCl excimer laser light with the wave length of 308 nm is used as the laser light 106. The beam size of the laser light 106 is formed such that it is elongated on the surface of the substrate 101, and the surface is scanned sequentially in the direction perpendicular to the direction of the elongated side so that the entire surface of the substrate is crystallized. Here, it is preferable to conduct the scanning such that the beams partially overlap one another. In this way, a given point of the first amorphous silicon film 105 is irradiated with the laser multiple times, and the uniformity of the crystal state can therefore be enhanced.

When the laser light 106 is radiated, the first amorphous silicon film 105 is crystallized in the process of instantaneously melting and solidifying, and then becomes a first crystalline silicon film 107. On the surface of the first crystalline silicon film 107, as shown in the figure, ridges are formed due to the difference in volumes between the melted state and the solid state in the melting and solidifying process. As the volume (thickness) of the first amorphous silicon film 105 increases, the ridge formed here becomes larger.

Next, as shown in FIG. 2(C), a crystalline silicon film (referred to as "first film" hereinafter) 108 that becomes a lower layer is formed by patterning the first crystalline silicon film 107. The first film 108 is formed in a region of the substrate 101 in which the TFD is to be formed, but is not formed in a region in which the TFT is to be formed. After that, a second amorphous semiconductor film (an amorphous silicon film, in this case) 109 is formed over the entire region of the substrate 101 in which the TFT and the TFD are to be formed. It is preferable to form the second amorphous silicon film 109 so as to make contact with the first film 108.

The second amorphous silicon film 109 can be formed by a known method such as the plasma CVD method or sputtering. The thickness of the second amorphous silicon film 109 is 25 nm or more and 60 nm or less. Here, the thickness is set to 40 nm, for example. That is, the first film 108 and the second amorphous silicon film 109 overlap in the region in which the TFD is to be formed, and the combined thickness of these films becomes 100 nm.

In this embodiment, in a portion 109b that is a part of the second amorphous silicon film 109 and that is positioned above the first film 108, the surface unevenness is formed following the profile of the ridges formed on the surface of the first film 108. Therefore, the surface roughness of the portion 109b is greater than the surface roughness of a portion 109a that is a part of the second amorphous silicon film 109 and that is not overlapping the first film 108.

Next, as shown in FIG. 2(D), the laser irradiation with laser light 110 is performed for the second amorphous silicon film 109 from above the substrate 101 so as to crystallize the second amorphous silicon film 109. In this embodiment, XeCl excimer laser light with the wave length of 308 nm is used as the laser light 110. The beam size of the laser light 110 is formed such that it is elongated on the surface of the substrate 101, and the surface is sequentially scanned in the direction perpendicular to the direction of the elongated side so that the entire surface of the substrate is crystallized. Here, it is preferable to conduct the scanning such that the beams partially overlap one another. In this way, a given point of the second amorphous silicon film 109 is irradiated with the laser multiple times, and the uniformity of the crystal state can therefore be enhanced.

When the laser light 110 is radiated, the second amorphous silicon film 109 is crystallized in the process of instantaneously melting and solidifying. Here, the melting and solidifying process for crystallization occurs not only in the second amorphous silicon film 109, but also in the surface portion of the first film 108 disposed below the second amorphous silicon film 109. As a result, a crystalline semiconductor film 111 including the first film 108 and a film that is formed by crystallizing the second amorphous silicon film 109 is formed.

The crystalline semiconductor film 111 includes a crystalline portion 111b that is positioned in the region in which the TFD is to be formed and that is formed from the second amorphous silicon film 109 and the first film 108, and a crystalline portion 111a that is positioned in the region in which the TFT is to be formed and that is formed from the second amorphous silicon film 109 only. Therefore, in the crystalline silicon film 111, the thickness of the crystalline portion 111b becomes greater than the thickness of the crystalline portion 111a by the amount corresponding to the thickness of the first film 108.

Also, as shown in the figure, in the obtained crystalline semiconductor film 111, the surface roughness of the crystalline portion 111b becomes greater than the surface roughness of the crystalline portion 111a for the reason described below.

In crystallizing the second amorphous silicon film 109, in the region in which the TFD is to be formed, the melting and solidifying process occurs not only in the second amorphous silicon film 109, but also in the surface portion of the first film 108. Therefore, the thickness of the semiconductor films that have been melted and solidified (the combined thickness of the second amorphous silicon film 109 and the surface portion of the first film 108 that has been melted and solidified) becomes greater than the thickness of the semiconductor film (thickness of the second amorphous silicon film 109) in the region in which the TFT is to be formed. As described above, as the volume (thickness) of a semiconductor film increases, respective ridges become larger. For this reason, on the surface of the crystalline portion 111b, the larger ridges are formed. Further, as described above, in the second amorphous silicon film 109, the surface roughness of the portion 109b disposed on the first film 108 is greater than the surface roughness of the portion 109a that is not overlapping the first film 108. This difference in the surface roughness is reflected to the crystalline semiconductor film 111 after the crystallization, and as a result, the larger ridges are formed on the surface of the crystalline portion 111b positioned on the first film 108.

Next, as shown in FIG. 2(E), resist layers 112 are respectively formed on the crystalline portions 111a and 111b of the crystalline silicon film 111.

Figure 3:
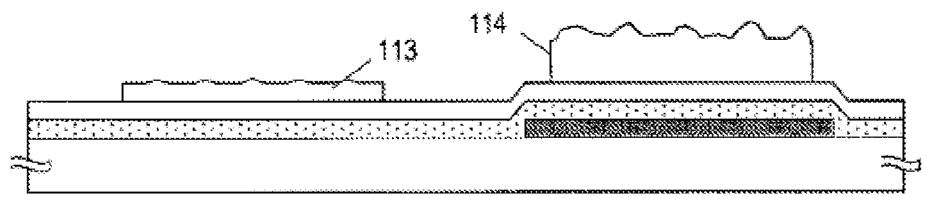
FIGS. 3(F) to 3(J) are cross-sectional diagrams schematically showing manufacturing steps of the semiconductor device according to Embodiment 1 of the present invention.
Figure 3:
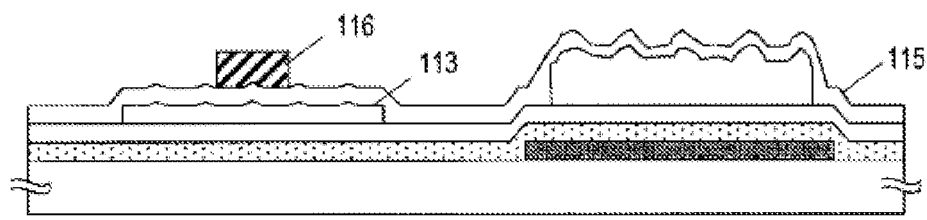
Figure 3:
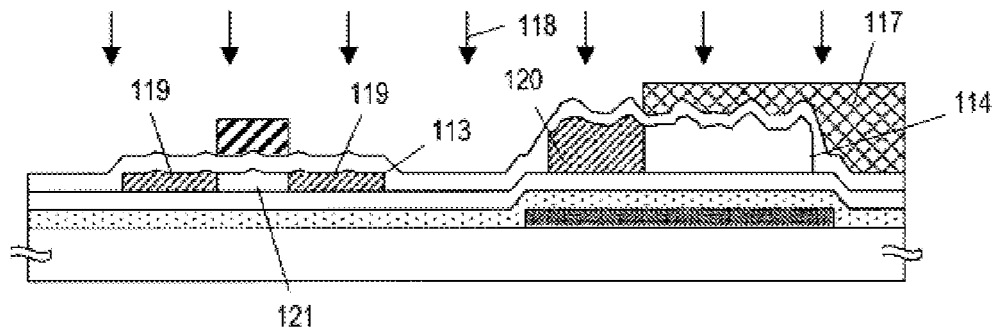
Figure 3:
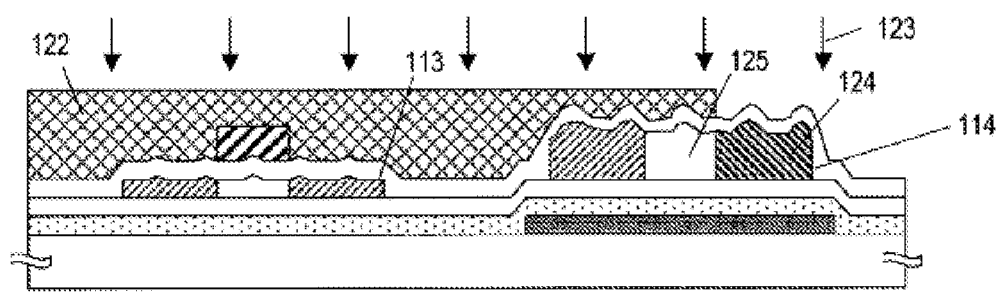
Figure 3:
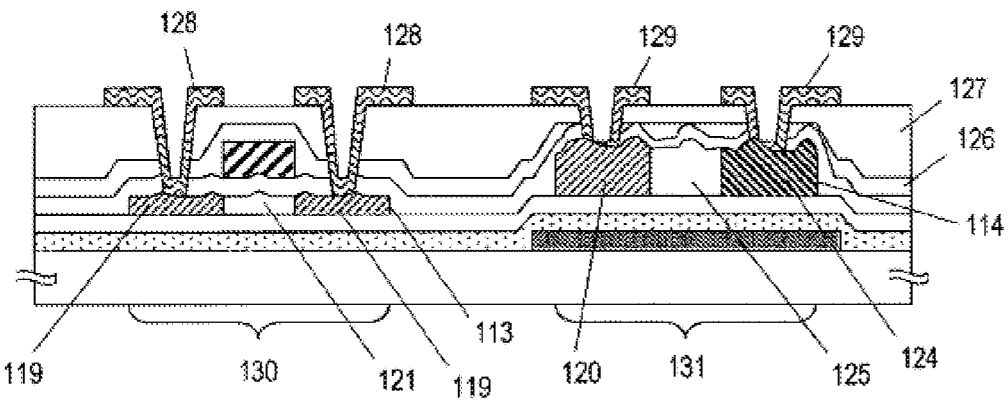

After that, as shown in FIG. 3(F), using the resist layers 112 as masks, unnecessary regions of the crystalline silicon film 111 are removed so that elements are separated. As a result, a semiconductor layer 113 that later becomes an active region of the TFT (source and drain regions, and a channel region) is formed of the crystalline portion 111a of the crystalline silicon film 111, and a semiconductor layer 114 that later becomes an active region of the TFD (n⁺-type/p⁺-type regions, and an intrinsic region) is formed of the crystalline portions 111b.

The obtained semiconductor layers 113 and 114 include crystalline portions formed by crystallizing the second amorphous semiconductor film 109. Specifically, the entire semiconductor layer 113 and an upper layer portion of the semiconductor layer 114 are formed from the same amorphous semiconductor film.

Next, as shown in FIG. 3(G), a gate insulating film 115 covering these island-shape semiconductor layers 113 and 114 is formed. Then, a gate electrode 116 for the to-be-formed TFT is formed on the gate insulating film 115.

It is preferable to use a silicon oxide film in the thickness of 20 to 150 nm for the gate insulating film 115. Here, a 100 nm-thick silicon oxide film is used.

The gate electrode 116 is formed by depositing a conductive film on the gate insulating film 115 with sputtering, the CVD method, or the like, and by patterning this conductive film. It is desirable to form the conductive film of a high melting point metal, such as W, Ta, Ti, or Mo, or an alloy thereof. Also, it is preferable that the thickness of the conductive film be 300 to 600 nm. In this embodiment, tantalum (thickness: 450 nm) with a minute amount of nitrogen added is used.

Next, as shown in FIG. 3(H), a mask 117 made of a resist is formed on the gate insulating film 115 so as to cover a part of the semiconductor layer 114 that becomes the active region of the TFD later. Then, in this condition, the entire surface of the substrate 101 is ion-doped with an n-type impurity (phosphorus) 118 from above. The phosphorus 118 is implanted into the semiconductor layers 113 and 114, passing through the gate insulating film 115. In this process, the phosphorus 118 is implanted into the region in the semiconductor layer 114 of the TFD that is not covered by the resist mask 117 and into the regions in the semiconductor layer 113 of the TFT that are not covered by the gate electrode 116. The phosphorus 118 is not doped into the regions covered by the resist mask 117 or by the gate electrode 116. As a result, in the semiconductor layer 113 of the TFT, the regions into which the phosphorus 118 was implanted become the source and drain regions 119 of the TFT that will be formed later. The region that is covered by the gate electrode 116 and is not implanted with the phosphorus 118 becomes the channel region 121 of the TFT later. Also, in the semiconductor layer 114 of the TFD, the region into which the phosphorus 118 was implanted becomes the n⁺-type region 120 of the to-be-formed TFD.

After removing the resist mask 117, as shown in FIG. 3(I), a mask 122 made of a resist is formed on the gate insulating film 115 so as to cover a part of the semiconductor layer 114 that will become the active region of the TFD later, and the entire semiconductor layer 113 that will become the active region of the TFT later. In this condition, the entire surface of the substrate 101 is ion-doped with a p-type impurity (boron) 123 from above. In this ion-doping, the boron 123 passes through the gate insulating film 115, and is implanted into the semiconductor layer 114. In this process, in the semiconductor layer 114 of the TFD, the boron 123 is implanted into a region not covered by the resist mask 122, and that region becomes the p$^+$-type region 124 of the to-be-formed TFD. Also, in the semiconductor layer 114 of the TFD, a region into which neither boron nor phosphorus was implanted will become the intrinsic region 125 later.

After removing the resist mask 122, a heat treatment is conducted under an inert atmosphere such as a nitrogen atmosphere. With this heat treatment, the source and drain regions 119 of the TFT and the n$^+$-type region 120 and the p$^+$-type region 124 of the TFD can recover from doping damages such as crystal defects generated during the doping. The phosphorus and the boron doped into the respective regions are also activated. A standard heating furnace can be used for this heat treatment, but it is preferable to use RTA (Rapid Thermal Annealing). In particular, the one that blows a hot inert gas to the surface of the substrate to instantaneously raise/lower the temperature can be suitably used.

Next, as shown in FIG. 3(J), a silicon nitride film 126 and a silicon oxide film 127 are formed in this order as interlayer insulating films. A heat treatment for hydrogenating the semiconductor layers 113 and 114, such as annealing at 350 to 450° C. under 1 atm of a nitrogen atmosphere or a hydrogen-mixed atmosphere, may be performed as necessary. Next, contact holes are formed in the interlayer insulating films 126 and 127. Then, a film made of a metal material (a two-layer film constituted of titanium nitride and aluminum, for example) is deposited on the interlayer insulating film 127 and the inside of the contact holes, and is patterned to form electrodes/wiring lines 128 of the TFT and electrodes/wiring lines 129 of the TFD. In a manner described above, a thin film transistor 130 and a thin film diode 131 can be obtained. Here, a protective film made of a silicon nitride film or the like may be disposed over the thin film transistor 130 and the thin film diode 131 to protect these elements.

According to the method described above, the film formation and crystallization process is performed twice. That is, the formation and crystallization process of the amorphous semiconductor film to form the first film 108 (first film formation and crystallization process), and the formation and crystallization process of the second film 109 (second film formation and crystallization process) are performed. This makes it possible to form the semiconductor layers 113 and 114 of different thicknesses and surface roughnesses without making the manufacturing process complicated.

The crystallization to form the first film 108 (first crystallization process) may be performed by a method other than the laser crystallization. As long as there is a film made of a crystalline semiconductor formed as the first film 108, the surface roughness of the semiconductor layers 113 and 114 can be made different by utilizing ridges generated in the second crystallization process. It is, however, preferable to form the first film 108 by the laser crystallization as in the above-mentioned method. This allows ridges to be formed on the surface of the first film 108, and therefore, in the second film 109, the surface unevenness of the portion 109b positioned on the first film 108 can be made larger than that of the other portion 109a. By using such a surface unevenness of the second film 109 in addition to the ridges generated in the second crystallization process, the difference in the surface roughnesses between the semiconductor layers 113 and 114 can be further increased.

The irradiation energy of laser light is not limited to a specific value and can be appropriately set in each crystallization process. In the first crystallization process (FIG. 2(B)), it is preferable to set the irradiation energy for the first film so as to be optimized for the amorphous semiconductor film 105 used to form the first film. In the second crystallization process (FIG. 2(D)), it is preferable to set the irradiation energy so as to be optimized for the second film 109. As a result, the crystalline portion (portion that becomes the active region of the TFT later) 111a having the highly desired crystallinity can be obtained, which can reliably ensure the TFT characteristics. On the other hand, the irradiation energy might become insufficient for the portion 109b of the second film 109 that overlaps the first film 108 (portion that becomes the active region of the TFD later). However, because the crystallization in the portion 109b develops under the influence of the crystal grain size of the first film 108, the crystallinity equivalent to that of the first film 108 can be obtained. Therefore, the crystalline portion (portion that becomes the active region of the TFD later) 111b having a high crystallinity equivalent to that of the crystalline portion 111a can be obtained. Even if the crystallinity of the active region of the TFD became slightly lower than the crystallinity of the active region of the TFT as a result of the insufficient irradiation energy for the portion 109b of the second film 109 that becomes the active region of the TFD, it will not largely affect the performance of the optical sensor TFD such as a sensor sensitivity.

According to this embodiment, the irradiation energy is optimized in the first and second crystallization processes, respectively. Therefore, the crystallinity of the semiconductor layer 114 of the TFD can be made higher than the crystallinity of the semiconductor layer of the TFD disclosed in Japanese Patent Application No. 2008-276023, for example, while ensuring the crystallinity of the semiconductor layer 113 of the TFT. As a result, the surface roughness of the semiconductor layer 114 also becomes greater than the surface roughness of the semiconductor layer of the TFD disclosed in Japanese Patent Application No. 2008-276023 mentioned above. Also, in Japanese Patent Application No. 2008-276023, the difference in surface roughnesses is achieved through a single laser crystallization in which an amorphous semiconductor film having different thicknesses is crystallized. On the other hand, in this embodiment, while the laser irradiation is performed only once to the second film that becomes the semiconductor layer 113 of the TFT, the laser irradiation is performed twice in total for the first film and the second film that become the semiconductor layer 114 of the TFD. Therefore, the difference in the surface roughnesses between the semiconductor layers 113 and 114 of the TFD and the TFT can be made greater than the difference in surface roughnesses obtained by the method described in Japanese Patent Application No. 2008-276023 mentioned above. As described above, according to this embodiment, it is possible to make the thickness difference ΔD as well as the difference in surface roughnesses between the semiconductor layers of the TFD and the TFT greater than the differences in thicknesses and surface roughnesses in the semiconductor device described in Japanese Patent Application No. 2008-276023 mentioned above. Therefore, the desired characteristics of the TFT and the TFD can be both achieved more reliably.

Embodiment 2

Hereinafter, Embodiment 2 of the semiconductor device according to the present invention will be explained with reference to figures. The semiconductor device of this embodiment has a configuration similar to that of the semiconductor device of Embodiment 1 (FIG. 1). However, this embodiment differs from Embodiment 1 in that the manufacturing process is further simplified by utilizing a pattern of a light shielding layer.

Figure 4:
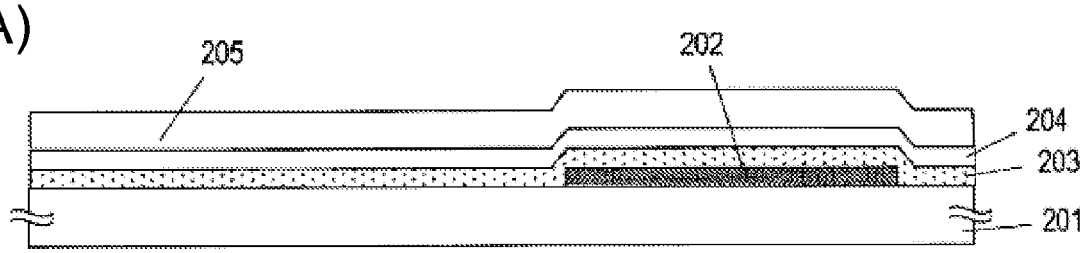
FIGS. 4(A) to 4(D) are cross-sectional diagrams schematically showing manufacturing steps of the semiconductor device according to Embodiment 2 of the present invention.
Figure 4:
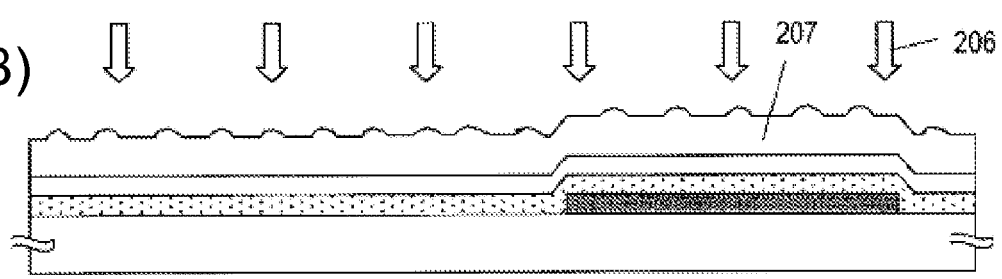
Figure 4:
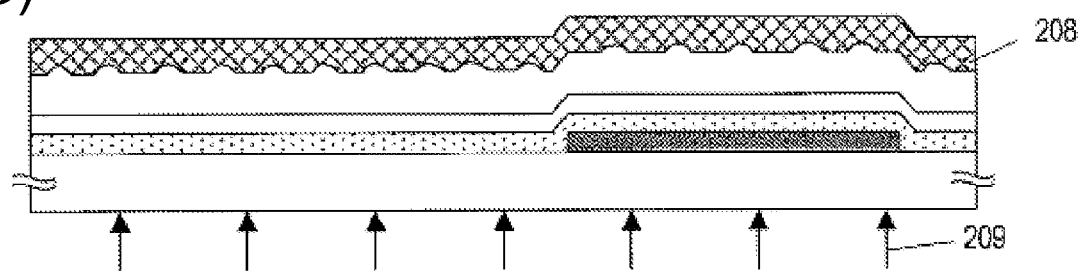
Figure 4:
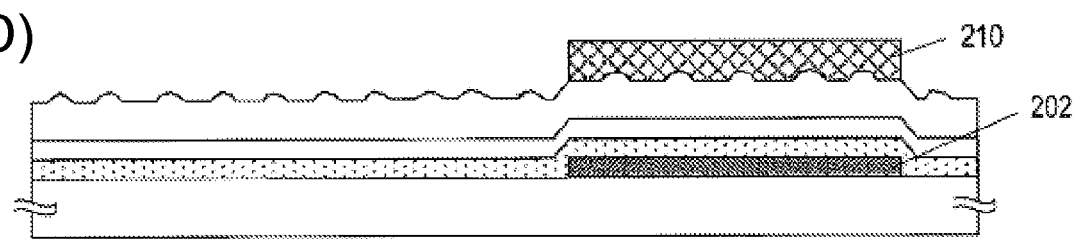

First, as shown in FIG. 4(A), a light shielding layer 202 is pattern-formed on a substrate 201, and then, a silicon nitride film 203 and a silicon oxide film 204 are formed thereon as underlying films. Next, a first amorphous silicon film 205 is formed. These films are formed by methods similar to the methods described above with reference to FIG. 2(A). Also, the thickness of the first amorphous silicon film 205 is set to 60 nm, for example.

Next, as shown in FIG. 4(B), the laser irradiation with laser light 206 is performed for the first amorphous silicon film 205 from above the substrate 201 so as to crystallize the first amorphous silicon film 205, and a first crystalline silicon film 207 is thereby obtained. In this embodiment, XeCl excimer laser light with the wave length of 308 nm is used as the laser light 206. In this manner, the first amorphous silicon film 205 is crystallized, and becomes the first crystalline silicon film 207. As shown in the figure, on the surface of the first crystalline silicon film 207, ridges are formed due to the difference in volumes between the melted state and the solid state in the melting and solidifying process. As the volume (thickness) of the first amorphous silicon film 205 increases, the ridge formed here becomes larger.

Next, as shown in FIG. 4(C), a photoresist 208 is applied over the first crystalline silicon film 207. Then, exposure 209 is performed to the photoresist 208 from the back surface side of the substrate 201. Here, a portion of the photoresist 208 that overlaps the light shielding layer 202 is not affected by the exposure.

After the exposure, the photoresist 208 is developed. Then, as shown in FIG. 4(D), a resist mask 210 having the same pattern as that of the light shielding layer 202 can be obtained.

Figure 5:
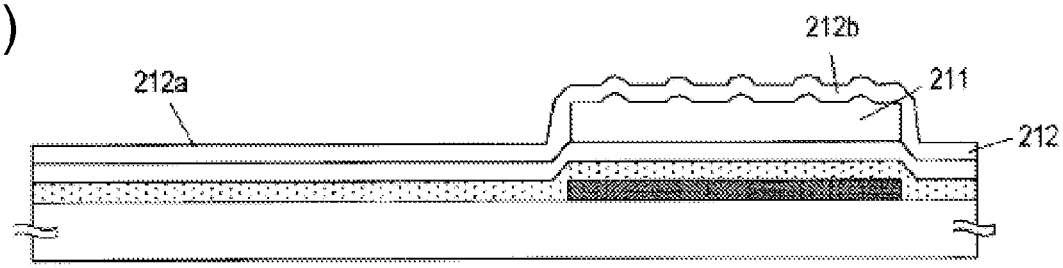
FIGS. 5(E) to 5(H) are cross-sectional diagrams schematically showing manufacturing steps of the semiconductor device according to Embodiment 2 of the present invention.
Figure 5:
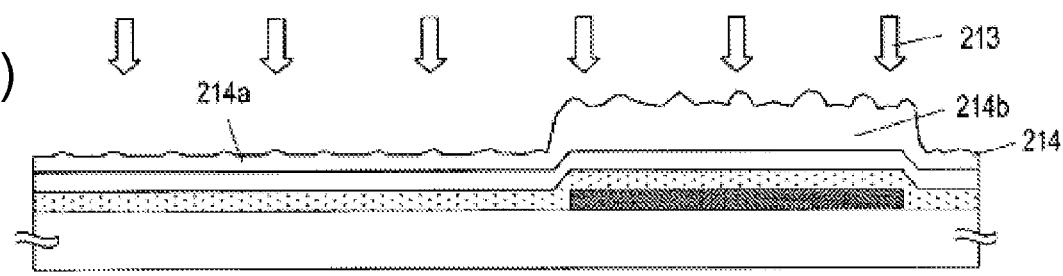
Figure 5:
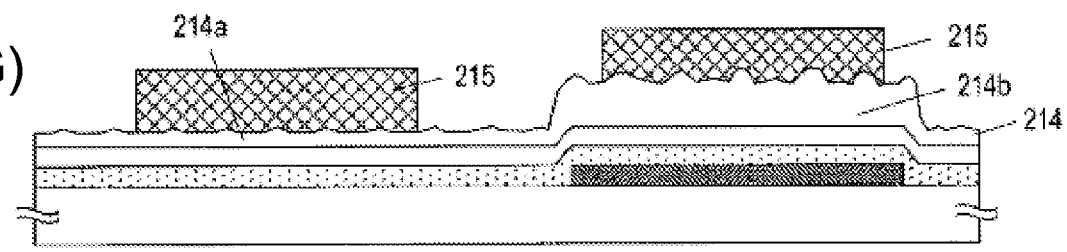
Figure 5:
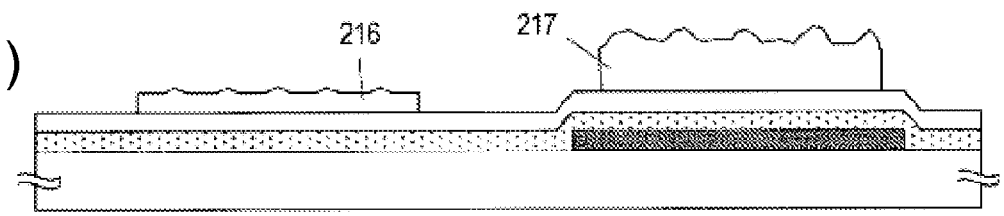

Next, as shown in FIG. 5(E), the first crystalline silicon film 207 is patterned using the resist mask 210. As a result, an island-shape crystalline silicon film (hereinafter, referred to as "first film") 211 having the same pattern as that of the light shielding layer 202 can be obtained. After that, the resist mask 210 is removed.

Next, as shown in FIG. 5(E), a second amorphous semiconductor film (an amorphous silicon film, in this case) 212 is formed over the entire substrate 201 so as to cover the first film 211. It is preferable to form the second amorphous silicon film 212 so as to make contact with the first film 211. The thickness of the second amorphous silicon film 212 is set to 40 nm, for example. Therefore, in the region in which the TFD is to be formed (region in which the light shielding layer 202 is formed), the first film 211 and the second amorphous silicon film 212 overlap, and the combined thickness of these films becomes 100 nm.

In this embodiment, in a portion 212b that is a part of the second amorphous silicon film 212 and that is positioned above the first film 211, the surface unevenness is formed following the profile of the ridges formed on the surface of the first film 211. Therefore, the surface roughness of the portion 212b is greater than the surface roughness of a portion 212a that is a part of the second amorphous silicon film 212 and that is not overlapping the first film 211.

Next, as shown in FIG. 5(F), the laser irradiation with laser light 213 is performed for the second amorphous silicon film 212 from above the substrate 201 so as to crystallize the second amorphous silicon film 212. In this embodiment, XeCl excimer laser light with the wave length of 308 nm is used as the laser light 213.

When the laser light 213 is radiated, the second amorphous silicon film 212 is crystallized in the process of instantaneously melting and solidifying. Here, the melting and solidifying process for crystallization occurs not only in the second amorphous silicon film 212, but also in the surface portion of the first film 211 disposed under the second amorphous silicon film 212. As a result, a crystalline semiconductor film 214 including the first film 211 and a film that is formed by crystallizing the second amorphous silicon film 212 is formed. The crystalline semiconductor film 214 includes a crystalline portion 214b that is positioned in the region in which the TFD is to be formed and that is formed from the second amorphous silicon film 212 and the first film 211, and a crystalline portion 214a that is positioned in the region in which the TFT is to be formed and that is formed from the second amorphous silicon film 212 only. Therefore, in the crystalline silicon film 214, the thickness of the crystalline portion 214b becomes greater than the thickness of the crystalline portion 214a by the amount corresponding to the thickness of the first film 211. Also, as described above with reference to FIG. 2(D), in the obtained crystalline semiconductor film 214, the surface roughness of the crystalline portion 214b becomes greater than the surface roughness of the crystalline portion 214a.

Next, as shown in FIG. 5(G), the resist layers 215 are respectively formed on the crystalline portions 214a and 214b of the crystalline semiconductor film 214.

After that, as shown in FIG. 5(H), using the resist layers 215 as a mask, unnecessary regions of the crystalline semiconductor film 214 are removed so that the elements are separated. As a result, a semiconductor layer 216 that later becomes the active region of the TFT (source and drain regions, and a channel region) is formed of the crystalline portion 214a of the crystalline semiconductor film 214, and a semiconductor layer 217 that later becomes the active region of the TFD (n$^+$-type and p$^+$-type regions, and an intrinsic region) is formed of the crystalline portions 214b.

Thereafter, although not shown in the figure, the TFT and the TFD are respectively fabricated using the semiconductor layers 216 and 217 by the method similar to the method of Embodiment 1 described above with reference to FIGS. 3(G) to 3(J).

According to this embodiment, the effects similar to those of Embodiment 1 can be obtained. Also, because the first crystalline silicon film 207 is patterned by the exposure from the back surface utilizing the pattern of the light shielding layer 202, the manufacturing process steps can be reduced as compared with the method described above with reference to FIGS. 2 and 3. Specifically, the number of photomasks to be used can be reduced by one as compared with the method in Embodiment 1. Therefore, the effects of the present invention can be obtained without greatly increasing the manufacturing process steps as compared with the conventional process.

Embodiment 3

Hereinafter, Embodiment 3 of the semiconductor device according to the present invention will be explained. In Embodiment 1 and Embodiment 2 described above, in order to explain the basic configuration of the present invention with clarity, the manufacturing methods of the semiconductor devices of the simplest configuration have been explained using the methods to form an N-channel TFT and an optical sensor TFD on the same substrate as examples. Here, a method of manufacturing a semiconductor device that has a plurality of TFTs and TFDs of different conductive types and configurations on the same substrate and that can be used for an electronic device having an optical sensor unit and a display unit will be explained.

The semiconductor device of this embodiment is an active matrix substrate of a display device that is equipped with an optical sensor function and that has a circuit section including a plurality of TFTs, a pixels section (also referred to as a display region) including a plurality of pixels, and an optical sensor section including optical sensor TFDs on the same substrate.

Figure 6:
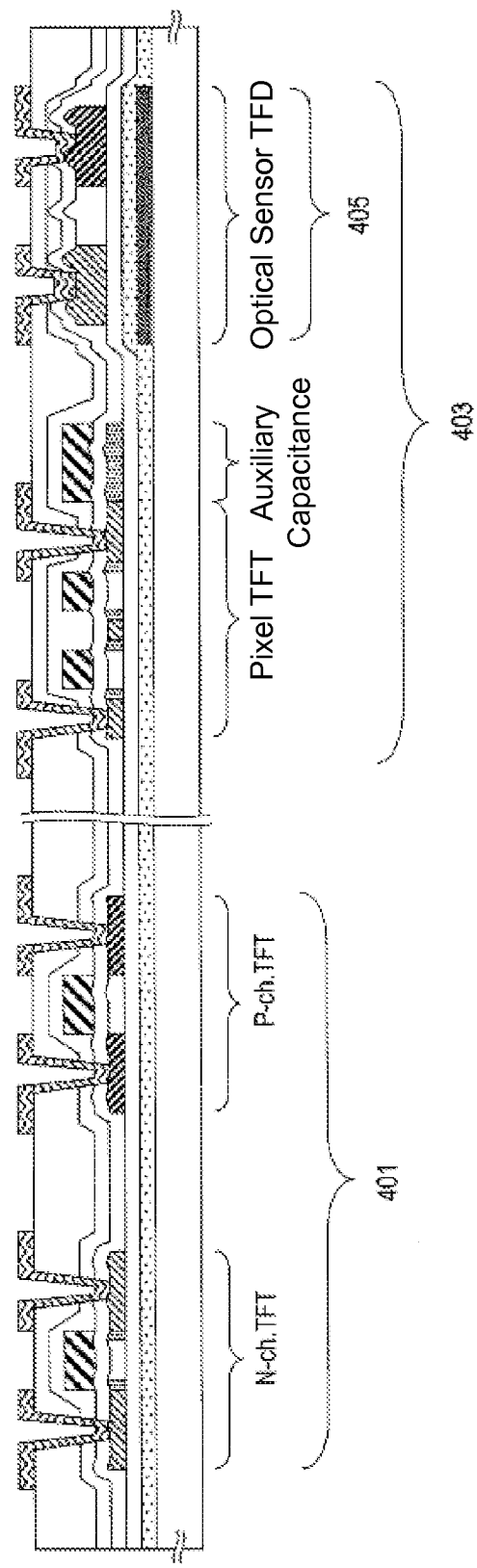
FIG. 6 is a cross-sectional diagram schematically showing a semiconductor device according to Embodiment 3 of the present invention.

FIG. 6 is a cross-sectional view schematically showing a part of the semiconductor device according to this embodiment.

The circuit section 401 includes an N-channel TFT and a P-channel TFT. In this embodiment, a TFT of the GOLD (Gate overlapped LDD) structure that has a high reliability against the hot carrier deterioration is used as the N-channel TFT. As the P-channel TFT, a TFT of a so-called single drain structure that has no LDD region is used.

The pixels section 403 includes TFTs (pixel TFTs) that are disposed with respect to the respective pixels and that work as switching elements, and auxiliary capacitors connected thereto. As the pixel TFT, a TFT of the LDD structure having LDD regions disposed with an offset to the sides of source and drain regions from a gate electrode to reduce the OFF current is used. Also, in order to divide an electric voltage applied between the source and the drain and to suppress the OFF current more effectively, it is preferable to have a structure in which two gate electrodes are arranged in series with respect to one semiconductor layer (dual-gate structure).

The optical sensor section 405 includes at least one optical sensor TFD. In this embodiment, the optical sensor section 405 is disposed inside of the pixels section 403 so as to correspond to one or a plurality of pixels. The optical sensor section 405, however, may not be disposed so as to correspond to a pixel or pixels, and it may be disposed in a region other than the pixels section 403 (frame region).

In this embodiment, all of the semiconductor layers (active regions) of the above-mentioned TFTs and TFDs are crystalline semiconductor layers, and have portions obtained by crystallizing the same amorphous semiconductor film. The semiconductor layers of the TFDs are thicker than the semiconductor layers of the TFTs. Also, the surface roughness of the semiconductor layers of the TFDs is greater than the surface roughness of the semiconductor layers of the TFTs. Further, the crystal states of the semiconductor layers of the TFT and the TFD are substantially same.

Such semiconductor layers are formed in the method similar to the above-mentioned methods of Embodiment 1 and Embodiment 2. First, a first film made of a crystalline semiconductor is formed in a region in which the TFD is to be formed. The first film is not formed in a region in which the TFTs are to be formed. Next, an amorphous semiconductor film (second film) is formed so as to cover the first film, and a semiconductor film made of the first film and the second film is formed. The semiconductor film becomes thicker in the region in which the TFD is to be formed by the thickness of the first film. Also, a portion of the semiconductor film positioned on the first film has a surface unevenness reflecting the surface roughness of the first film. After that, laser is radiated to the semiconductor film from above the second film so as to form a crystalline semiconductor film. The obtained crystalline semiconductor film is thicker and has larger ridges in the region in which the TFD is to be formed than in the region in which the TFTs are to be formed. The semiconductor layers of the TFT and of the TFD are obtained by patterning this crystalline semiconductor film. As a result, the semiconductor layer of the optical sensor TFD becomes thicker than the semiconductor layers of the N-channel TFT, the P-channel TFT, and the pixel TFT, and a semiconductor layer that becomes a lower electrode of an auxiliary capacitor. Also, the surface roughness of the TFD becomes greater than the surface roughness of the semiconductor layers of these TFTs.

One example of the manufacturing method of the semiconductor device according to this embodiment will be explained more specifically.

Figure 7:
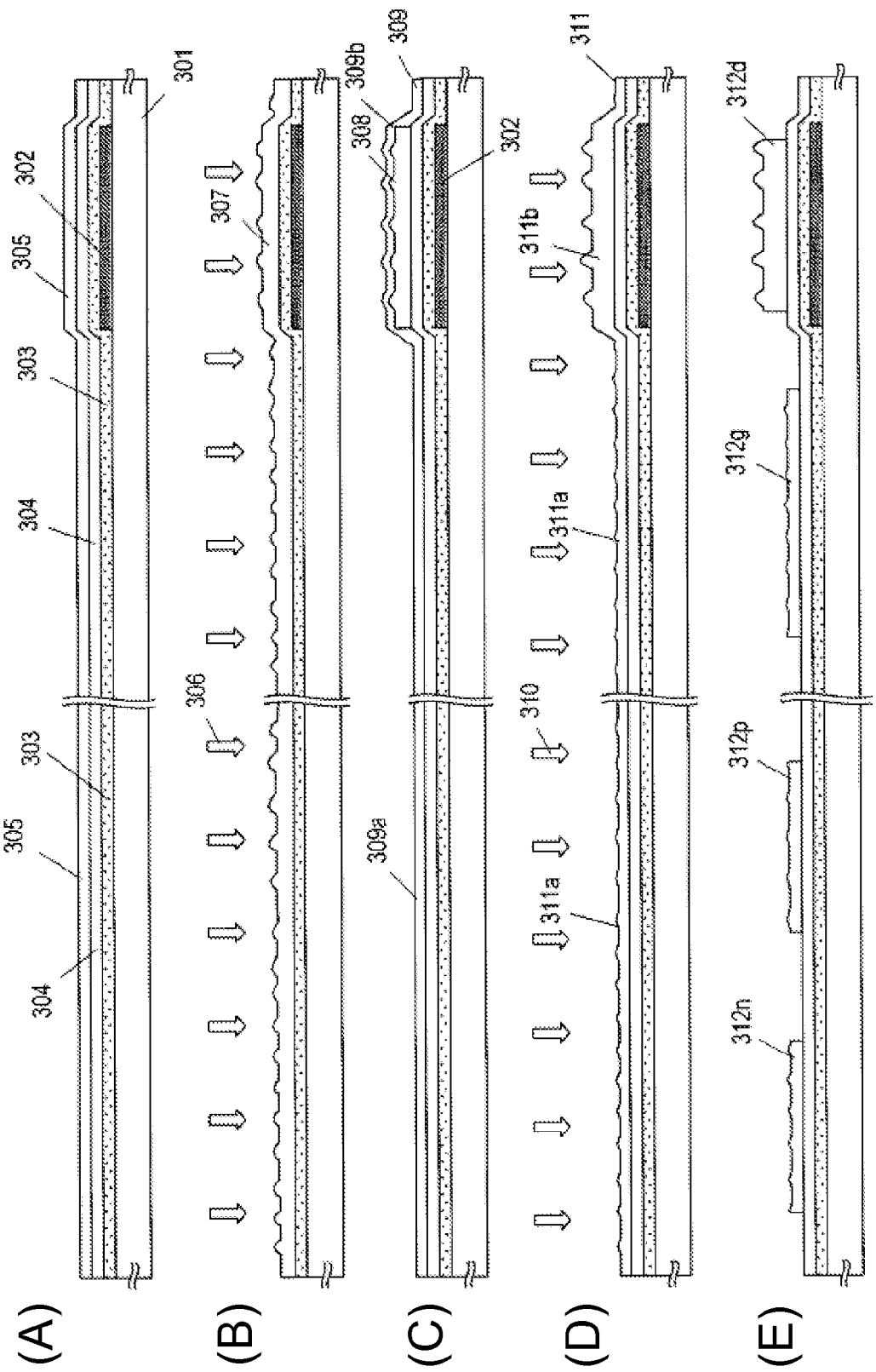
FIGS. 7(A) to 7(E) are cross-sectional diagrams schematically showing manufacturing steps of the semiconductor device according to Embodiment 3 of the present invention.

First, as shown in FIG. 7(A), a light shielding layer 302 is pattern-formed on a substrate 301, and then, a silicon nitride film 303 and a silicon oxide film 304 are formed thereon as underlying films. Next, a first amorphous semiconductor film (here, an amorphous silicon film) 305 is formed. These films are formed in the methods similar to the methods described above with reference to FIG. 2(A). Also, the thickness of the first amorphous silicon film 305 is set to 60 nm, for example.

Next, as shown in FIG. 7(B), laser irradiation with laser light 306 is performed for the first amorphous silicon film 305 from above the substrate 301 so as to crystallize the first amorphous silicon film 305, and a first crystalline silicon film 307 is thereby obtained. The crystallization method and conditions are similar to the method and the conditions of the above-mentioned embodiments. On the surface of the first crystalline silicon film 307, a plurality of ridges are formed as shown in the figure.

Next, as shown in FIG. 7(C), the first crystalline silicon film 307 is patterned to form an island-shape first film 308 made of crystalline silicon in a region of the substrate 301 in which the TFD is to be formed. In a manner similar to the method described above with reference to FIGS. 4(C) and 4(D), the patterning of the first crystalline silicon film 307 may be performed by the exposure from the back surface utilizing the pattern of the light shielding layer 302.

Thereafter, on the first film 308, a film made of amorphous silicon (referred to as "second film") 309 is formed over the entire surface of the substrate 301. The thickness of the second film 309 is set to 40 nm. In the second film 309, a portion 309b positioned on the first film 308 has a surface unevenness formed following the profile of the ridges formed on the surface of the first film 308. Therefore, the surface roughness of the portion 309b is greater than the surface roughness of a portion 309a that does not overlap the first film 308. Also, the thickness of the portion in which the first film 308 and the second film 309 overlap is 100 nm, which is greater than the thickness of the portion that only includes the second film 309 by the thickness of the first film 308.

Next, as shown in FIG. 7(D), laser irradiation with laser light 310 is performed for the second film 309 from above the substrate 301 for the crystallization, and a crystalline silicon film 311 is thereby obtained. The crystallization method and conditions are similar to the method and the conditions of the above-mentioned embodiments.

The crystalline silicon film 311 includes a crystalline portion 311b that is positioned in the region in which the TFD is to be formed and that is formed of the second film 309 and the first film 308, and a crystalline portion 311a that is positioned in the region in which the TFTs are to be formed and that is formed of the second film 309 only. Therefore, in the crystalline silicon film 311, the thickness of the crystalline portion 311b becomes greater than the thickness of the crystalline portion 311a by the amount corresponding to the thickness of the first film 309. Also, as described above with reference to FIG. 2(D), in the obtained crystalline semiconductor film 311, the surface roughness of the crystalline portion 311b becomes greater than the surface roughness of the crystalline portion 311a.

Next, as shown in FIG. 7(E), the crystalline silicon film 311 is patterned to form 312n, 312p, 312g, and 312d. Here, a semiconductor layer 312n that will later become the active region of the N-channel TFT, a semiconductor layer 312p that will later become the active region of the P-channel TFT, and a semiconductor layer 312g that will later become the active region of the pixel TFT and a lower electrode of the auxiliary capacitor are formed of the crystalline portion 311a of the crystalline silicon film 311 that is thinner and has a smaller surface roughness. A semiconductor layer 312d that will later become the active region of the optical sensor TFD is formed of the crystalline portion 311b that is thicker and has a greater surface roughness.

Figure 8:
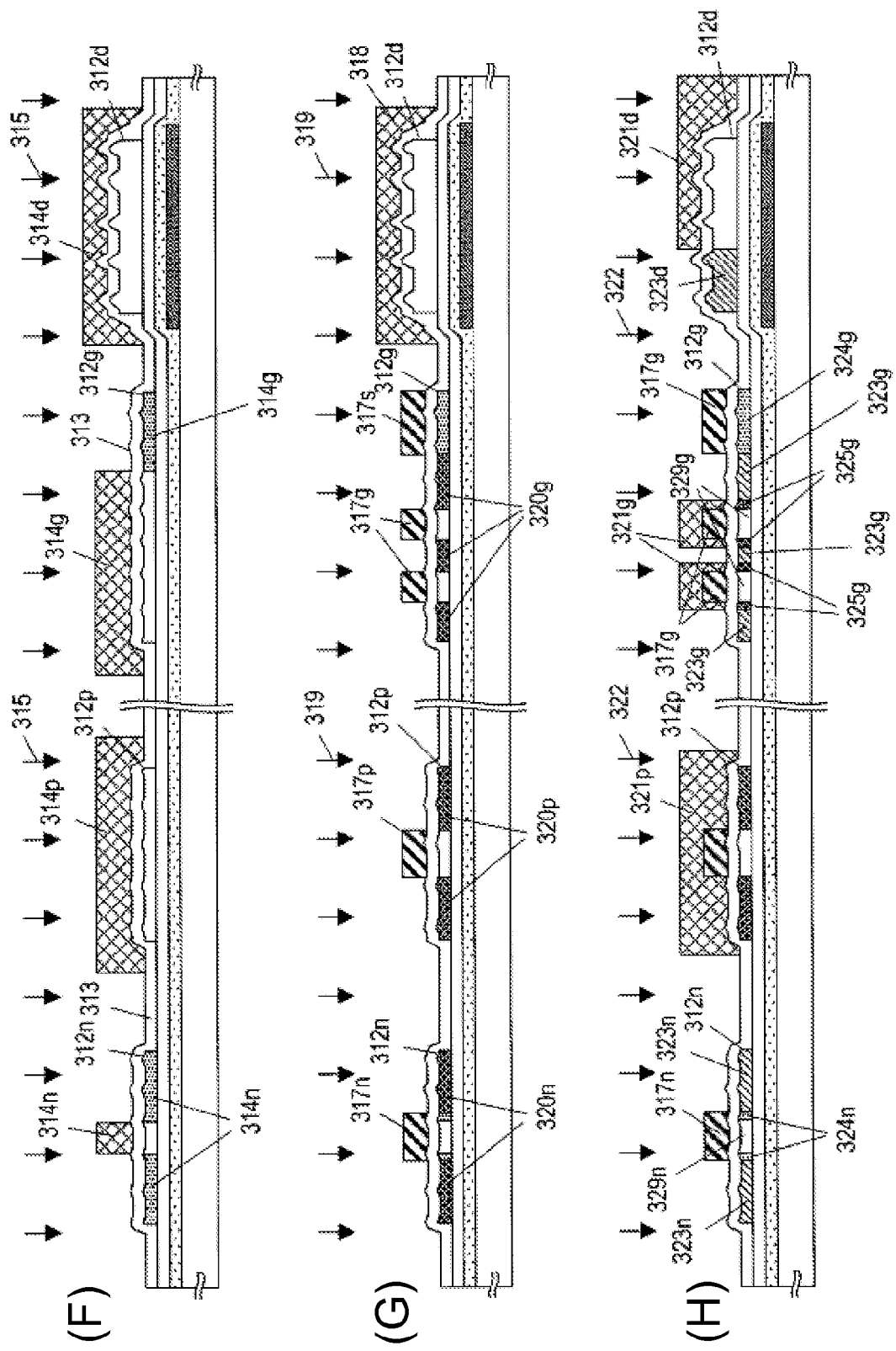
FIGS. 8(F) to 8(H) are cross-sectional diagrams schematically showing manufacturing steps of the semiconductor device according to Embodiment 3 of the present invention.

Next, as shown in FIG. 8(F), a gate insulating film 313 is formed so as to cover these semiconductor layers 312n, 312p, 312g, and 312d. After that, on the gate insulating film 313, doping masks 314n, 314p, 314g, and 314d made of a photoresist are formed. The doping mask 314n is disposed so as to cover a portion of the semiconductor layer 312n that becomes the channel region. The doping mask 314g is disposed so as to cover the semiconductor layer 312g except for a portion that becomes the auxiliary capacitor. The doping masks 314p and 314d are disposed so as to cover the entire semiconductor layers 312p and 312d, respectively.

In this condition, a first low-concentration n-type impurity (phosphorus) 315 is doped into the portions of the semiconductor layers 312n and 312g that are not covered with the doping masks 314n and 314g. As a doping gas, phosphine ($PH_3$) is used. The acceleration voltage is set in a range of 60 to 90 kV (70 kV, for example). The dosage is set in a range of $1 \times 10^{12}$ to $1 \times 10^{14}$ cm$^{-2}$ ($2 \times 10^{13}$ cm$^{-2}$, for example). As a result, first low-concentration n-type regions 314n are formed in the portions of the semiconductor layer 312n that becomes the active region of the N-channel TFT (portions that become source and drain regions as well as LDD regions). Also, a first low-concentration n-type region 314g is formed in the portion (portion that becomes the auxiliary capacitor) of the semiconductor layer 312g that becomes the active region of the pixel TFT and the auxiliary capacitor. The low-concentration phosphorus 315 is not implanted into other regions.

Next, after removing the doping masks 314n, 314p, 314g, and 314d, as shown in FIG. 8(G), gate electrodes 317n and 317p are formed over the semiconductor layers 312n and 312p, respectively. Also, over the semiconductor layer 312g, two gate electrodes 317g and an upper electrode 317s of the auxiliary capacitor unit are formed. Then, a resist mask 318 is disposed so as to cover the entire semiconductor layer 312d of the TFD.

The gate electrode 317n is disposed over the semiconductor layer 312n so as to overlap the portion that becomes the channel region and also overlap portions of the low-concentration n-type regions 314n located on both sides of the aforementioned portion that becomes the channel region. The gate electrode 317p is disposed over the semiconductor layer 312p so as to overlap the portion that becomes the channel region. The gate electrodes 317g are disposed over the semiconductor layer 312g so as to overlap two portions that become the channel regions, respectively.

In this condition, a second n-type impurity (phosphorus) 319 is doped into the semiconductor layers 312n, 312p, and 312g at a low concentration. As a doping gas, phosphine ($PH_3$) is used. The acceleration voltage is set in a range of 60 to 90 kV (70 kV, for example). The dosage is set in a range of $1 \times 10^{12}$ to $1 \times 10^{14}$ cm$^{-2}$ ($2 \times 10^{13}$ cm$^{-2}$, for example). As a result, second low-concentration n-type regions 320n, 320p, and 320g are respectively formed in the portions of these semiconductor layers 312n, 312p, and 312g that are not covered with the gate electrodes 317n, 317p, and 317g and the upper electrode 317s.

After removing the resist mask 318, as shown in FIG. 8(H), new resist masks 321p, 321g, and 321d are formed on the semiconductor layers 312p, 312g, and 312d, respectively. The resist mask 321p is formed so as to cover the entire semiconductor layer 312p. The resist masks 321g are disposed on the semiconductor layer 312g so as to cover the respective gate electrodes 317g and portions of the second low-concentration n-type regions 320g that are positioned below the both ends of the respective gate electrodes 317g. The resist mask 321d is disposed so as to cover the semiconductor layer 312d except for the portion that becomes an n-type region.

In this condition, a high concentration doping with an n-type impurity (phosphorus) 322 is performed. As a doping gas, phosphine ($PH_3$) is used. The acceleration voltage is set in a range of 60 to 90 kV (70 kV, for example). The dosage is set in a range of $1 \times 10^{15}$ to $1 \times 10^{16}$ cm$^{-2}$ ($5 \times 10^{15}$ cm$^{-2}$, for example). As a result, source and drain regions 323n are formed in the portions that are part of the semiconductor layer 312n that becomes the active region of the N-channel TFT and that are not covered with the gate electrode 317n. Also, the portions of the second low concentration n-type region that are covered with the gate electrode 317n, and into which the phosphorus 322 was not implanted, become GOLD regions 324n. A portion that is sandwiched by the GOLD regions 324n, and into which the phosphorus 322 was not implanted, becomes a channel region 329n. The phosphorus 322 is not implanted into the semiconductor layer 312p that becomes the active region of the P-channel TFT. On the other hand, in the semiconductor layer 312g that becomes the active region of the pixel TFT and the auxiliary capacitor, the portions that are not covered with the resist masks 321g, and into which the phosphorus 322 was implanted at a high concentration, become source and drain regions 323g. In the second low concentration n-type region, the portions that are covered with the resist masks 321g, and into which the phosphorus 322 was not implanted, become LDD regions 325g. Also, in the semiconductor layer 312g, the portions covered with the gate electrodes 317g become channel regions 329g, and the portion covered with the upper electrode 317s remains the first low concentration n-type region and becomes a lower electrode 324g of the auxiliary capacitor. Further, in the semiconductor layer 312d that becomes the active region of the TFD, an n-type region 323d is formed in the portion not covered with the resist mask 321d.

In this specification, an LDD region overlapped by a gate electrode is referred to as "GOLD region" to distinguish it from an LDD region not overlapped by (disposed with an offset from) a gate electrode (which is simply referred to as "LDD region").

Figure 9:
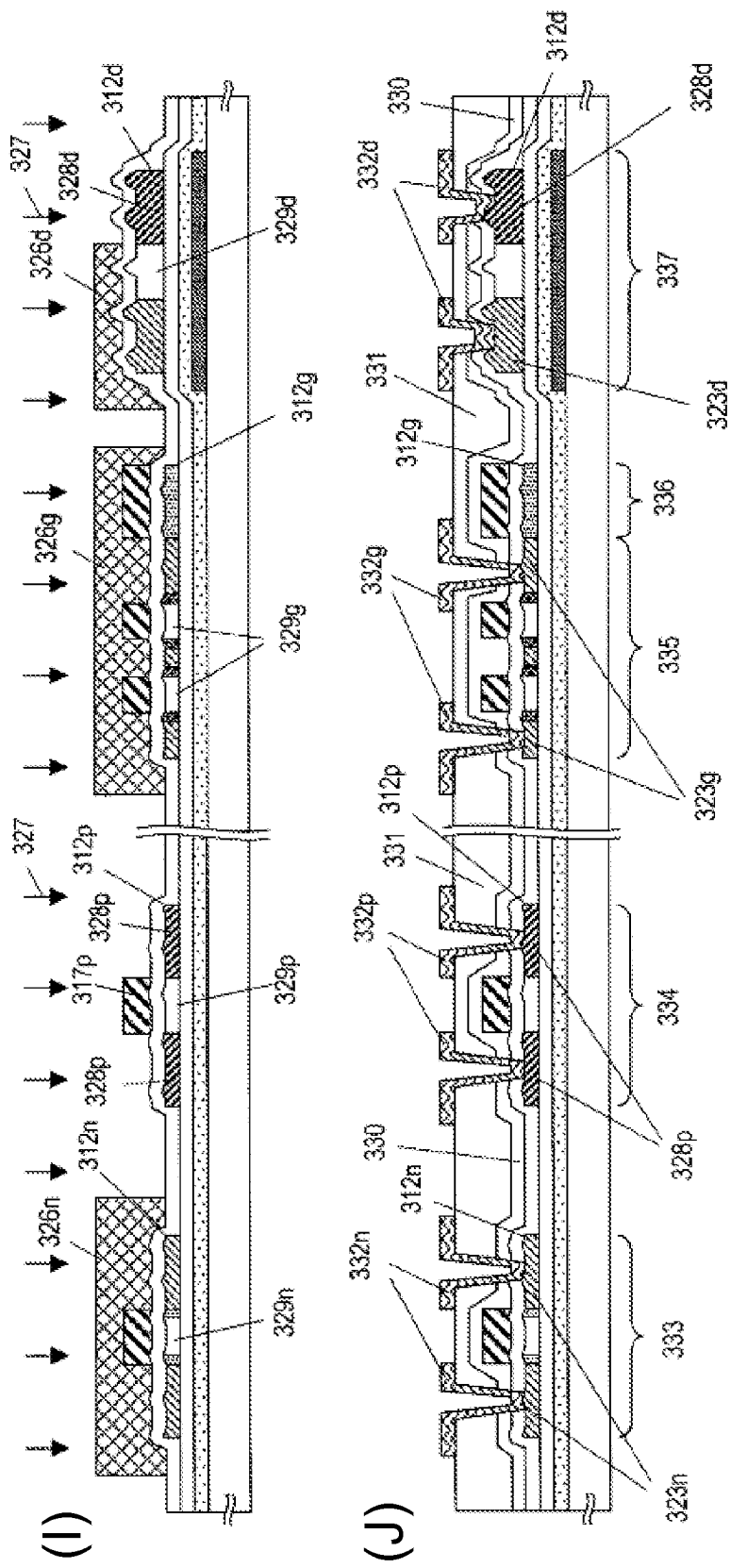
FIGS. 9(I) and 9(J) are cross-sectional diagrams schematically showing manufacturing steps of the semiconductor device according to Embodiment 3 of the present invention.

Next, the resist masks 321p, 321g, and 321d are removed, and new resist masks 326n, 326g, and 326d are formed over the semiconductor layers 312n, 312g, and 312d, respectively, as shown in FIG. 9(I). The resist masks 326n and 326g are formed so as to cover the entire semiconductor layers 312n and 312g, respectively. The resist mask 326d is disposed so as to cover the semiconductor layer 312d except for the portion that becomes a p-type region.

In this condition, a high concentration doping with a p-type impurity (boron) 327 is performed. As a doping gas, diborane ($B_2H_6$) is used. The acceleration voltage is set in a range of 40 to 90 kV (75 kV, for example). The dosage is set in a range of $1 \times 10^{15}$ to $1 \times 10^{16}$ cm$^{-2}$ ($3 \times 10^{15}$ cm$^{-2}$, for example). As a result, in the semiconductor layer 312p that becomes the active region of the P-channel TFT, source and drain regions 328p are formed in the portions not covered with the gate electrode 317p. The portion of the semiconductor layer 312p that is covered with the gate electrode 317p, and into which the boron 327 was not implanted, becomes a channel region 329p. The high concentration boron 327 is not implanted into the semiconductor layers 312n and 312g. In the semiconductor layer 312d of the TFD, the high concentration boron 327 is implanted into a portion thereof, which becomes a p-type region 328d. A portion of the semiconductor layer 312d that has neither phosphorus nor boron implanted into becomes an intrinsic region 329d.

Next, after the resist masks 326n, 326g, and 326d are removed, a heat treatment is performed to activate the impurities (phosphorus and boron) implanted into the respective semiconductor layers. The method and conditions of the activation process may be similar to the method and conditions described in Embodiment 1 (FIG. 3(I)), for example.

Next, as shown in FIG. 9(J), a silicon nitride film 330 and a silicon oxide film 331 are formed in this order as interlayer insulating films. A heat treatment for hydrogenation may be conducted if necessary. After that, in a manner similar to the method described above with reference to FIG. 3(J), contact holes are formed in the interlayer insulating films 330 and 331, and then, electrodes/wiring lines 332n, 332p, 332g, and 332d are formed.

In this manner, an N-channel thin film transistor 333, a P-channel thin film transistor 334, a pixel thin film transistor 335, an auxiliary capacitor 336, and a thin film diode 337 can be obtained. Contact holes may be formed on the gate electrodes of the thin film transistors 333 and 334 constituting a circuit such that the gate electrodes are connected to source and drain regions or gate electrodes of other TFTs on the substrate through the source and drain wiring lines. Also, a protective film may be disposed on these elements as necessary.

According to this embodiment, similar to the embodiments described above, the surface roughness of the semiconductor layer of the thin film diode 337 is greater than the surface roughness of the semiconductor layers of the thin film transistors 333 to 335. Therefore, in the thin film diode 337, the reflection of light on the surface of the semiconductor layer can be suppressed. Also, because the semiconductor layer of the thin film diode 337 is thicker than the semiconductor layers of the thin film transistors 333 to 335, the optical absorption rate thereof can be enhanced. Therefore, the optical sensitivity can be improved in a synergistic manner, resulting in the increase in the light current and the improvement of the SN ratio.

Also, because the thickness and the surface roughness of the semiconductor layers of the thin film transistors 333 to 335 are maintained smaller, the following effects can be achieved.

In the thin film transistor 335, which is a pixel TFT, a leakage current at the time of OFF operation can be suppressed. Therefore, backlight bleeding and the display non-uniformity caused by the leakage current can be suppressed, and failures such as dot defects can be reduced. In the thin film transistors 333 and 334 constituting a driver circuit, the breakdown voltage characteristics and the reliability against gate bias stress of the gate insulating film can be enhanced. Also, because the sub-threshold characteristics and the field effect mobility can be enhanced, the driving capacity of the driver circuit can be improved.

Further, the thickness and the surface roughness of the semiconductor layer constituting the lower electrode of the auxiliary capacitor 336 are also maintained small. Therefore, the breakdown voltage characteristics of the auxiliary capacitor section can be improved, and the rate of failure such as dot defects caused by leakages that occurs in the auxiliary capacitor 336 can be thereby reduced.

As described above, according to this embodiment, the semiconductor layers of the thin film transistors 333 to 335 and the semiconductor layer 337 of the thin film diode (optical sensor TFD) can be optimized according to the respective applications and requirements, and therefore, the required device characteristics can be respectively achieved. As a result, it is possible to provide a compact and ideal interactive display device with a high sensor sensitivity, a high quality displaying capability, and a smaller non-display region.

Also, according to the manufacturing method of this embodiment, the display device described above can be manufactured at a low cost with a fewer number of process steps. In particular, as shown in the above-mentioned method, because the doping process to form the source and drain regions of the thin film transistors 333 to 335 and the doping process to form the n-type or p-type region of the thin film diode 337 are performed simultaneously, the manufacturing process can be further simplified. Further, this method becomes more advantageous when the P-channel and the N-channel thin film transistors 334 and 333 are formed simultaneously (a CMOS structure TFT), because the n-type impurity doping process for the thin film diode 337 and the thin film transistor 333 can be performed simultaneously, and the p-type impurity doping process for the thin film diode 337 and the thin film transistor 334 can be performed simultaneously.

Embodiment 4

In this embodiment, display devices equipped with a sensor function will be explained. Such display devices are configured with a semiconductor device of any one of the above-mentioned embodiments.

A display device equipped with a sensor function according to this embodiment is a liquid crystal display device with a touch sensor, for example, and includes a display region and a frame region disposed around the display region. The display region includes a plurality of display units (pixels) and a plurality of optical sensor units. Each display unit includes a pixel electrode and a pixel switching TFT, and each optical sensor unit includes a TFD. In the frame region, a display driver circuit for driving the respective display units is disposed. Driver circuit TFTs are used in the driver circuit. The pixel switching TFT, the driver circuit TFT, and the TFD in the optical sensor unit are formed on the same substrate by the method described in Embodiments 1 to 3. In the display device of the present invention, among the TFTs used in the display device, at least the pixel switching TFT needs to be formed on the same substrate with the TFD of the optical sensor unit by the above-mentioned method. That is, the driver circuit may be disposed on a different substrate separately, for example.

In this embodiment, the optical sensor unit is disposed adjacent to the corresponding display unit (a pixel of a primary color, for example). A single display unit may have a single optical sensor unit, or may have a plurality of optical sensor units. Alternatively, a single optical sensor unit may be disposed for each set of a plurality of display units. A single optical sensor unit can be disposed for color display pixels constituted of pixels of three primary colors (RGB), for example. As described above, the number of the optical sensor units relative to the number of the display units (density) can be appropriately selected according to a resolution.

When a color filter is disposed on a viewer's side of the optical sensor unit, the sensitivity of the TFD constituting the optical sensor unit may be deteriorated. Therefore, it is preferable that no color filter be disposed on the viewer's side of the optical sensor unit.

The configuration of the display device according to this embodiment is not limited to the above-mentioned configuration. The TFD of the optical sensor can be disposed in the frame region to configure a display device equipped with an ambient light sensor that controls a display brightness according to the brightness of ambient light, for example. Also, a color filter can be disposed on the viewer's side of the optical sensor unit. In this way, light through the color filter is received by the optical sensor unit, and the optical sensor unit can thereby function as a color image sensor.

Hereinafter, with reference to figures, a configuration of the display device according to this embodiment will be explained using a touch panel liquid crystal display device equipped with a touch panel sensor as an example.

Figure 10:
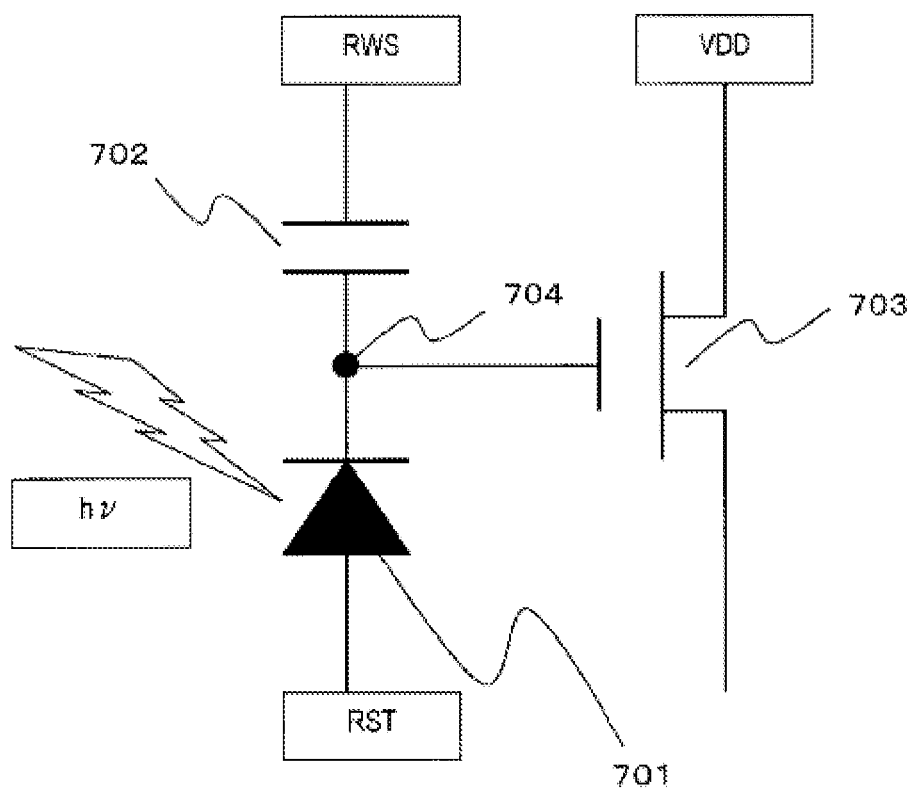
FIG. 10 is a circuit diagram of an optical sensor TFD according to Embodiment 4 of the present invention.

FIG. 10 is a circuit diagram illustrating an example of the configuration of the optical sensor unit disposed in the display region. The optical sensor unit has a thin film diode 701 for an optical sensor, a capacitor 702 for signal storage, and a thin film transistor 703 for retrieving signals stored in the capacitor 702. After an RST signal is input and RST potential is written in a node 704, when the potential of the node 704 lowers due to the leakage caused by light, the gate potential of the thin film transistor 703 changes and the TFT gate therefore opens/closes. The signal VDD can be extracted in this way.

Figure 11:
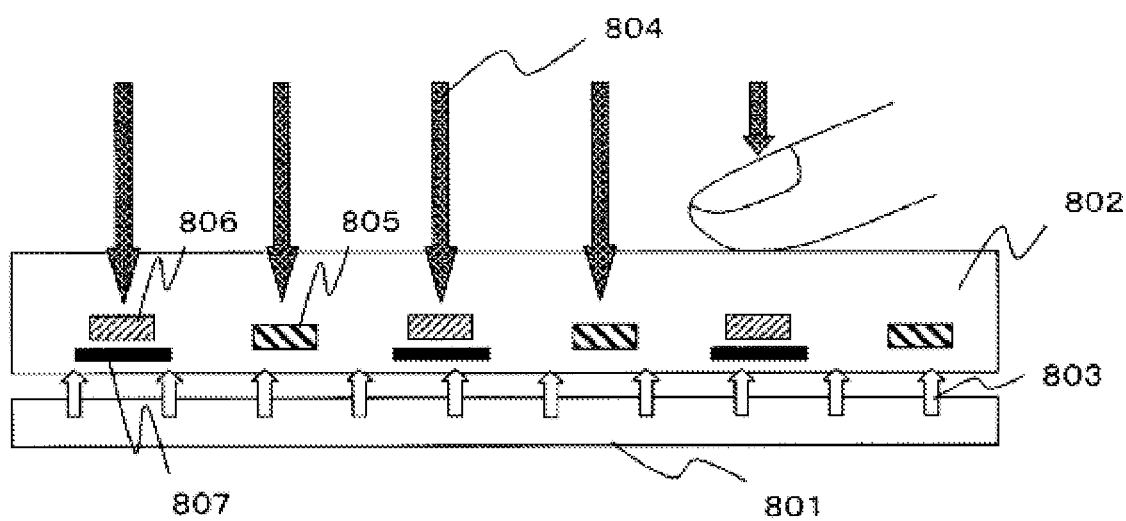
FIG. 11 is a configuration diagram of an optical sensor type touch panel according to Embodiment 4 of the present invention.

FIG. 11 is a cross-sectional view schematically showing an example of an active matrix type touch panel liquid crystal display device. In this example, one optical touch sensor unit including an optical sensor unit is disposed for each pixel.

The liquid crystal display device shown in the figure includes a liquid crystal module 802 and a backlight 801 disposed on the rear surface side of the liquid crystal module 802. Although not shown in the figure, the liquid crystal module 802 is constituted by a light-transmissive rear substrate, a front substrate disposed opposite to the rear substrate, and a liquid crystal layer disposed between these substrates, for example. The liquid crystal module 802 has a plurality of display units (primary color pixels), and each display unit has a pixel electrode (not shown) and a pixel switching thin film transistor 805 connected to the pixel electrode. Also, an optical touch sensor unit including a thin film diode 806 is disposed adjacent to each display unit. Although not shown in the figure, a color filter is disposed for each display unit on the viewer's side. No color filter is disposed on the viewer's side of the optical touch sensor unit. A light shielding layer 807 is disposed between the thin film diode 806 and the backlight 801. Therefore, light from the backlight 801 is blocked by the light shielding layer 807 and does not enter the thin film diode 806, and the thin film diode 806 therefore receives ambient light 804 only. The incidence of this ambient light 804 is detected by the thin film diode 806. In this manner, a photo-sensing touch panel is achieved. The light shielding layer 807 needs to be disposed such that at least the light from the backlight 801 is blocked from entering the intrinsic region of the thin film diode 806.

Figure 12:
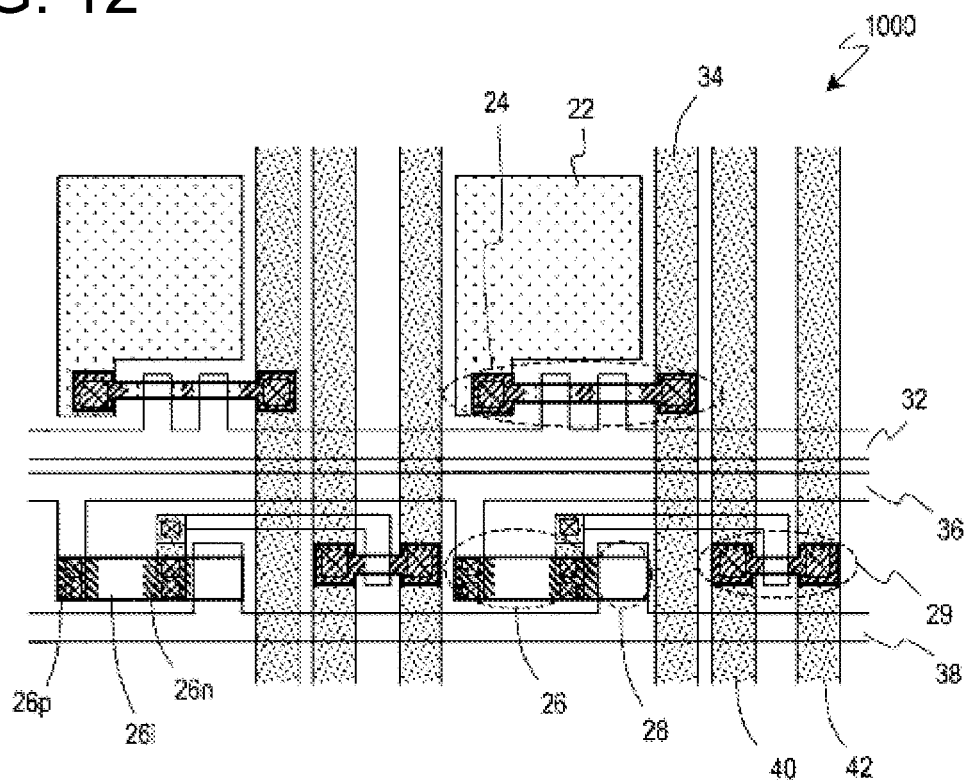
FIG. 12 is a plan view schematically illustrating a rear substrate in the touch panel type liquid crystal display device according to Embodiment 4 of the present invention.

FIG. 12 is a plan view schematically showing an example of the rear substrate in the active matrix type touch panel liquid crystal display device. The liquid crystal display device according to this embodiment is constituted by a large number of pixels (R, G, and B pixels), but the figure here only shows two pixels for simplification.

A rear substrate 1000 includes a plurality of display units (pixels), each of which includes a pixel electrode 22 and a pixel switching thin film transistor 24, and optical touch sensor units that are disposed adjacent to the respective display units and that has an optical sensor photodiode 26, a capacitor 28 for signal storage, and an optical sensor follower thin film transistor 29.

The thin film transistor 24 has a configuration similar to that of the TFT explained in Embodiment 3, which is a dual gate LDD structure including two gate electrodes and LDD regions, for example. In the thin film transistor 24, the source region is connected to a pixel source bus line 34, and the drain region is connected to the pixel electrode 22. The thin film transistor 24 is turned on/off by a signal from a pixel gate bus line 32. In this manner, the pixel electrode 22 and a common electrode formed on a front substrate placed opposite to the rear substrate 1000 apply voltages to the liquid crystal layer to change the orientation state of the liquid crystal layer for performing display.

On the other hand, the optical sensor photodiode 26 has a configuration similar to that of the TFD explained in Embodiment 3, and includes a $p^+$-type region $26p$, an $n^+$-type region $26n$, and an intrinsic region $26i$ interposed between these regions $26p$ and $26n$, for example. The capacitor 28 for signal storage uses a gate electrode layer and an Si layer as the electrodes and forms a capacitor with the gate insulating film. In the optical sensor photodiode 26, the $p^+$-type region $26p$ is connected to an optical sensor RST signal line 36, and the $n^+$-type region $26n$ is connected to the lower electrode (Si layer) in the capacitor 28 for signal storage, and further connected to an optical sensor RWS signal line 38 through this capacitor 28. Further, the $n^+$ region $26n$ is connected to the gate electrode layer in the optical sensor follower thin film transistor 29. The source and drain regions of the optical sensor follower thin film transistor 29 are respectively connected to an optical sensor VDD signal line 40 and an optical sensor COL signal line 42.

As described above, the optical sensor photodiode 26, the capacitor 28 for signal storage, and the optical sensor follower thin film transistor 29 are corresponding to the thin film diode 701, the capacitor 702, and the thin film transistor 703 in the driver circuit shown in FIG. 10, respectively, and are constituting a driver circuit of the optical sensor. The photo-sensing operation of this driver circuit will be explained hereinafter.

(1) First, an RWS signal is written in the capacitor 28 for signal storage by the RWS signal line 38. This generates a positive electric field in the $n^+$-type region $26n$ side of the optical sensor photodiode 26, creating the reverse bias state of the optical sensor photodiode 26. (2) In the optical sensor photodiode 26 located in a region of the surface of the substrate that is irradiated with light, the light leakage is generated, and the electrical charges are thereby released to the RST signal line 36 side. (3) As a result, the electrical potential of the $n^+$-type region $26n$ side is lowered, and by this change in the electric potential, the gate voltage applied to the optical sensor follower thin film transistor 29 is changed. (4) On the source side of the optical sensor follower thin film transistor 29, the VDD signal is applied from the VDD signal line 40. When the gate voltage is changed as described above, the value of electric current flowing into the COL signal line 42 connected to the drain side is changed, and therefore, the electric signal can be extracted from the COL signal line 42. (5) An RST signal from the COL signal line 42 is written in the optical sensor photodiode 26 to reset the electrical potential of the capacitor 28 for signal storage. Photo-sensing can be performed by repeating the above-mentioned operations (1) to (5) in a scanning manner.

The configuration of the rear substrate of the touch panel liquid crystal display device according to this embodiment is not limited to the configuration shown in FIG. 12. The auxiliary capacitor (Cs) may be disposed for each pixel switching TFT, for example. Also, in the example shown in the figure, the optical touch sensor unit is disposed adjacent to each one of the RGB pixels. However, as described above, one optical touch sensor unit may be disposed for a set of three pixels having the RGB pixels (color display pixels).

Here, FIG. 11 is referenced again. In the example described above, as shown in the cross-sectional view in FIG. 11, the thin film diode 806 is disposed in the display region and used as a touch sensor. However, the thin film diode 806 may also be disposed outside of the display region and used as an ambient light sensor that controls the luminance of the backlight 801 according to the brightness of the ambient light 804.

Figure 13:
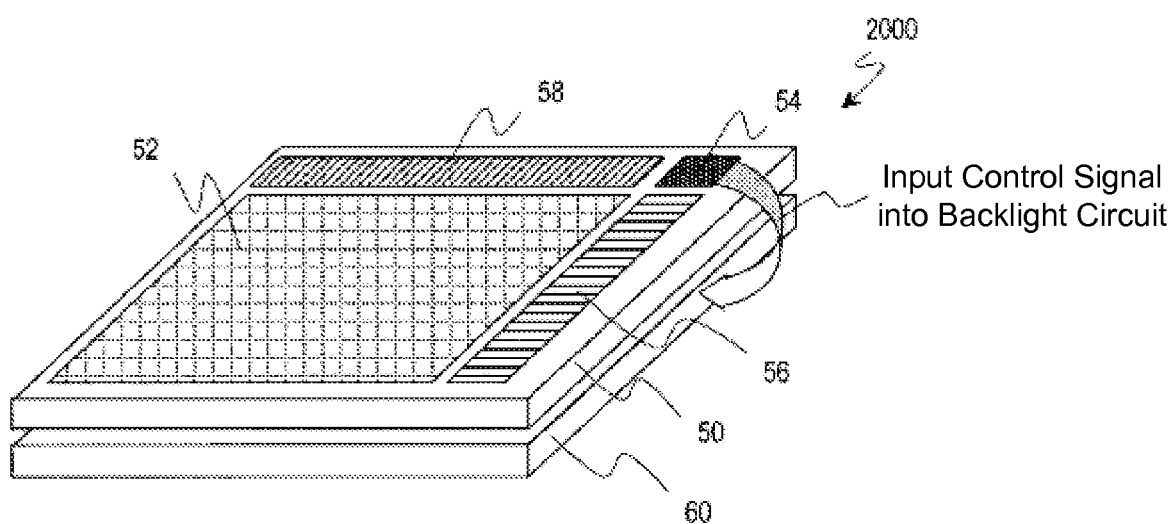
FIG. 13 is a perspective view illustrating a liquid crystal display device with an ambient light sensor according to Embodiment 4 of the present invention.

FIG. 13 is a perspective view illustrating an example of the liquid crystal display device equipped with an ambient light sensor. A liquid crystal display device 2000 includes an LCD substrate 50 having a display region 52, a gate driver 56, a source driver 58, and an optical sensor unit 54, and a backlight 60 disposed on the rear surface side of the LCD substrate 50. In the LCD substrate 50, the region that is disposed around the display region 52 and that has the drivers 56 and 58 as well as the optical sensor unit 54 may also be referred to as a "frame region."

The luminance of the backlight 60 is controlled by a backlight control circuit (not shown). Although not shown in the figure, TFTs are used in the display region 52 and in the drivers 56 and 58, and TFDs are used in the optical sensor unit 54. The optical sensor unit 54 generates an illuminance signal according to the brightness of ambient light and outputs the signal to the backlight control circuit through the connection using a flexible substrate. The backlight control circuit generates backlight control signals according to this illuminance signal and outputs a control signal to the backlight 60.

An organic EL display device with an ambient light sensor can also be configured using the present invention. Similar to the liquid crystal display device shown in FIG. 13, such an organic EL display device can be configured to have a display unit and an optical sensor unit on the same substrate. There is, however, no need to dispose the backlight 60 on the rear surface side of the substrate. In this case, the optical sensor unit 54 is connected to the source driver 58 through wiring lines disposed in the substrate 50, and the illuminance signal from the optical sensor unit 54 is input into the source driver 58. The source driver 58 changes the luminance of the display unit 52 according to the illuminance signal.

The specific embodiments of the present invention have been described above, but the present invention is not limited to such embodiments, and various modifications can be made based on the technical concept of the present invention. The TFTs of the present invention can also be used to form a circuit for analog driving and a circuit for digital driving on a glass substrate simultaneously. In case of a circuit for analog driving, for example, the circuits include a source side driver circuit, pixel units, and a gate side driver circuit. The source side driver circuit includes a shift register, a buffer, and a sampling circuit (transfer gate). The gate side driver circuit includes a shift register, a level shifter, and a buffer. A level shifter circuit may be disposed between the sampling circuit and the shift register, if necessary. Also, according to the manufacturing method of the present invention, a memory or a microprocessor can be formed as well.

According to the present invention, a semiconductor device that has, on the same substrate, a TFT and a TFD with desired characteristics can be obtained by using semiconductor films optimized for the respective semiconductor elements. Therefore, TFTs that have a high field effect mobility and a high ON/OFF ratio and that are used for driver circuits and for pixel electrode switching, and TFDs that have a low dark current value and a high light SN ratio (the ratio of the current value under the light to the current value in the darkness) and that are used as optical sensors can be fabricated in the same manufacturing process. Among these semiconductor layers, by optimizing the surface roughness and the thickness of the channel region of the TFT that largely affects the field effect mobility, and the surface roughness and the thickness of the intrinsic region of the TFD that largely affects the optical sensitivity in particular, the optimal element characteristics for the respective semiconductor elements can be achieved. Further, because such a high performance semiconductor device can be manufactured by the simpler method, not only the size reduction and the performance enhancement of a product can be achieved, but also the manufacturing cost thereof can be reduced.

INDUSTRIAL APPLICABILITY

The present invention can be widely used for a semiconductor device including a TFT and a TFD, and for electronic devices in every field having such a semiconductor device. The present invention can be used for a CMOS circuit or a pixel unit in an active matrix liquid crystal display device as well as an organic EL display device, for example. Such display devices can be used for a display screen of a mobile phone or a portable gaming device, a monitor of a digital camera, or the like, for example. Therefore, the present invention can be used for all electronic devices including a liquid crystal display device or an organic EL display device.

In particular, the present invention can be suitably used for display devices, such as an active matrix liquid crystal display device and an organic EL display device, an image sensor, an optical sensor, or an electronic device configured by combining such. It is particularly advantageous to use the present invention for a display device equipped with an optical sensor function utilizing a TFD, and an electronic device including such a display device. Also, the present invention can also be used for an image sensor including an optical sensor that uses a TFD, and a driver circuit that uses a TFT.

DESCRIPTION OF REFERENCE CHARACTERS 101 substrate
102 light shielding layer
103, 104 underlying films
105 first amorphous semiconductor film (amorphous silicon film)
107 first crystalline semiconductor film (crystalline silicon film)
108 first film (crystalline silicon film)
109 second amorphous semiconductor film (amorphous silicon film)
109a portion of second amorphous semiconductor film not overlapping first film
109b portion of second amorphous semiconductor film overlapping first film
111 crystalline semiconductor film (crystalline silicon film)
111a thinner portion of crystalline semiconductor film
111b thicker portion of crystalline semiconductor film 113, 114 island-shape semiconductor layers
115 gate insulating film
116 gate electrode
112, 117 masks
118 n-type impurity (phosphorus)
119 source and drain regions
120 n$^+$-type region
121 channel region
123 p-type impurity (boron)
124 p$^+$-type region
125 intrinsic region
126, 127 interlayer insulating films
128 electrodes/wiring lines of thin film transistor
129 electrodes/wiring lines of thin film diode
130 thin film transistor
131 thin film diode

The invention claimed is:

1. A semiconductor device comprising:
a thin film transistor that includes a semiconductor layer including a channel region, a source region, and a drain region, a gate electrode that controls conductivity of the channel region, and a gate insulating film disposed between the semiconductor layer and the gate electrode; and
a thin film diode that includes a semiconductor layer including at least an n-type region and a p-type region,
wherein the semiconductor layer of the thin film transistor and the semiconductor layer of the thin film diode are both crystalline semiconductor layers,
wherein the semiconductor layer of the thin film transistor and the semiconductor layer of the thin film diode include portions formed by crystallizing a same amorphous semiconductor film,
wherein a thickness of the semiconductor layer of the thin film diode is greater than a thickness of the semiconductor layer of the thin film transistor,
wherein a difference between the thickness of the semiconductor layer of the thin film transistor and the thickness of the semiconductor layer of the thin film diode is greater than 25 nm, and
wherein surface roughness of the semiconductor layer of the thin film diode is greater than surface roughness of the semiconductor layer of the thin film transistor.

2. The semiconductor device according to claim 1, wherein an arithmetic average roughness Ra of a surface of the semiconductor layer of the thin film diode is greater than an arithmetic average roughness Ra of a surface of the semiconductor layer of the thin film transistor.

3. The semiconductor device according to claim 1, wherein a maximum height Rz of the surface of the semiconductor layer of the thin film diode is greater than a maximum height Rz of the surface of the semiconductor layer of the thin film transistor.

4. The semiconductor device according to claim 1, wherein ridges are formed on the surfaces of the semiconductor layer of the thin film transistor and the semiconductor layer of the thin film diode, and
wherein an average height of the ridges formed on the surface of the semiconductor layer of the thin film diode is greater than an average height of the ridges formed on the surface of the semiconductor layer of the thin film transistor.

5. The semiconductor device according to claim 1, wherein ridges are present on boundaries of crystal grains included in the semiconductor layers.

6. The semiconductor device according to claim 1,
wherein the thin film diode further comprises an intrinsic region disposed between the n-type region and the p-type region of the semiconductor layer of the thin film diode, and
wherein, in the semiconductor layer of the thin film diode, surface roughness of at least the intrinsic region is greater than the surface roughness of the semiconductor layer of the thin film transistor.

7. The semiconductor device according to claim 1, wherein the thin film transistor is a plurality of thin film transistors including an N-channel thin film transistor and a P-channel thin film transistor.

8. A display device, comprising:
a display region having a plurality of display units;
a frame region disposed around the display region; and
an optical sensor unit including a thin film diode,
wherein each of the display units includes an electrode and a thin film transistor connected to the electrode,
wherein the thin film transistor and the thin film diode are formed on a same substrate,
wherein the thin film transistor comprises a semiconductor layer including a channel region, a source region, and a drain region, a gate insulating film disposed so as to cover the semiconductor layer, and a gate electrode disposed on the gate insulating film,
wherein the thin film diode comprises a semiconductor layer including at least an n-type region and a p-type region,
wherein the semiconductor layer of the thin film transistor and the semiconductor layer of the thin film diode are both crystalline semiconductor layers,
wherein the semiconductor layer of the thin film transistor and the semiconductor layer of the thin film diode include portions formed by crystallizing a same amorphous semiconductor film,
wherein a thickness of the semiconductor layer of the thin film diode is greater than a thickness of the semiconductor layer of the thin film transistor,
wherein a difference between the thickness of the semiconductor layer of the thin film transistor and the thickness of the semiconductor layer of the thin film diode is greater than 25 nm, and
wherein surface roughness of the semiconductor layer of the thin film diode is greater than surface roughness of the semiconductor layer of the thin film transistor.

9. The display device according to claim 8,
wherein the display region further comprises a backlight and a backlight control circuit that adjusts a luminance of light emitted by the backlight, and
wherein the optical sensor unit generates an illuminance signal according to a brightness of ambient light and outputs the signal to the backlight control circuit.

10. The display device according to claim 9, comprising a plurality of optical touch sensor units each of which has the aforementioned optical sensor unit,
wherein each of the plurality of optical touch sensor units are disposed in the display region so as to correspond to each of the display units or to each of a set of two or more display units.

* * * * *